(12) United States Patent
Saho et al.

(10) Patent No.: US 6,332,324 B1
(45) Date of Patent: Dec. 25, 2001

(54) CRYOSTAT AND MAGNETISM MEASUREMENT APPARATUS USING THE CRYOSTAT

(75) Inventors: Norihide Saho, Tsuchiura; Hisashi Isogami, Ushiku; Minoru Morita, Chiyoda-machi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/529,766

(22) PCT Filed: Jun. 7, 1999

(86) PCT No.: PCT/JP99/03052

§ 371 Date: Apr. 19, 2000

§ 102(e) Date: Apr. 19, 2000

(87) PCT Pub. No.: WO99/64796

PCT Pub. Date: Dec. 16, 1999

(30) Foreign Application Priority Data

Jun. 12, 1998 (JP) .................................................. 10-165307

(51) Int. Cl.⁷ .................................................. F25B 19/00
(52) U.S. Cl. ................................................ 62/51.1; 62/383

(58) Field of Search ...................................... 62/51.1, 383

(56) References Cited

U.S. PATENT DOCUMENTS

5,339,650 * 8/1994 Hakamada et al. .................... 62/51.1
5,787,714 * 8/1998 Ohkura et al. ......................... 62/51.1

FOREIGN PATENT DOCUMENTS

| 2230059 | 9/1990 | (JP) . |
| 4194765 | 7/1992 | (JP) . |
| 6197879 | 7/1994 | (JP) . |
| 6275872 | 9/1994 | (JP) . |

* cited by examiner

*Primary Examiner*—Ronald Capossela
(74) *Attorney, Agent, or Firm*—Antonelli, Terry, Stout & Kraus, LLP

(57) ABSTRACT

Coolant (3) whose boiling point is higher than the temperature of cooled SQUID elements (2) as cooled objects is poured into an inner container (37) for containing SQUID elements. The SQUID elements (2) are soaked in the coolant (3). Before the inner container (37) for containing SQUID elements is used, the coolant (3) is cooled and solidified by a refrigerator (7).

25 Claims, 10 Drawing Sheets

CRYOSTAT AND MAGNETISM MEASUREMENT APPARATUS USING THE CRYOSTAT

TECHNICAL FIELD OF THE INVENTION

The present invention relates to a cryostat suitable for containing objects to be cooled such as SQUID elements (Superconducting Quantum Interference Devices) which are used in a medical diagnosis apparatus to measure magnetic flux generated from a measured sample, for examples, a human body, a living thing, etc., a measurement apparatus for measuring physical property such as the permeability of a sample, and so on, and further relates to a magnetism measurement apparatus using the cryostat.

Meanwhile, a SQUID element is an element to measure very small changes of external magnetic flux by making use of quantum-inference effects at a Josephson junction in a superconducting state. Also, the magnetism measurement means a measurement of magnetic flux, permeability, and so on.

BACKGROUND OF THE INVENTION

SQUID elements are put in liquid helium, liquid nitrogen, and so on in a heat insulating container (cryostat etc.), and are maintained at a very low temperature. In a circuit using a direct current SQUID (dc-SQUID) element of a recent typical SQUID element, if magnetic flux is added to a SQUID element loop of the circuit using the SQUID element, which includes a Josephson junction, the voltage generating between terminals of the loop oscillates with a frequency depending on the strength of flux quanta at the Josephson junction. By detecting the oscillating voltage, magnetic flux intersecting the loop is detected with a high sensitivity.

To set the Josephson junction in a superconducting state, it is necessary to cool the Josephson junction under its superconduction temperature. As a structure to cool SQUID elements as mentioned above, the following structures are well known, that is: a structure in which SQUID elements are put and cooled in coolant such as liquid helium, liquid nitrogen, etc., in a cryostat for containing SQUID elements, or a structure in which SQUID elements are directly cooled by a refrigerator.

Further, as to the above cryostat for containing SQUID elements, the cryostat is placed along with a measured sample in a magnetic shield room surrounded by a shield member made of ferro-magnetic material such as permalloy in order to shield external magnetic flux. An example of a conventional cryostat for containing SQUID elements which are put and cooled in coolant such as liquid helium, liquid nitrogen, etc., is disclosed in Japanese Patent Application Laid-Open Hei. 7-321382.

In a conventional-type cryostat for containing SQUID elements which are put and cooled in coolant such as liquid helium, etc., since a group of SQUID elements is put in coolant, the troupe of SQUID elements are uniformly cooled at the same temperature. However, although the cryostat is composed by using a vacuum heat-insulating container because heat enters into a very low temperature part from the outside of a room temperature, the liquid helium gradually evaporates. Accordingly, it is necessary to supply coolant every week. Since the supply operations of liquid helium are very complicated, and liquid helium is very expensive, an increase of the operational cost is indispensable.

In a structure to solve the above-mentioned problems, for example, in the structure of an image processing apparatus for a medical measurement of nuclear magnetic resonance, using a superconducting magnet, which is disclosed in Japanese Patent Application Laid-Open Hei. 7-321382, a refrigerator is incorporated into a cryostat with a vacuum heat-insulating structure, and the heat entering into a very low temperature part from the outside of a room temperature is removed by the refrigerator in order to reduce the amount of vaporizing liquid helium. However, it is still necessary to supply liquid helium every a half of a year, and this supply operations of liquid helium are still very complicated. Moreover, if the vacuum in the vacuum heat-insulating structure is broken down, the liquid helium in the cryostat for containing SQUID elements instantaneously expands, and the pressure in the cryostat rapidly increases, which may break the cryostat. Thus, the safety is not completely secured by the above structure.

Further, when the cryostat for containing SQUID elements is used under an operational condition in which the cryostat is declined, or a measured sample is measured from a place lower than the measured sample in the upper direction by the SQUID elements in the cryostat which has been inverted, the head parts of the SQUID elements are exposed to a gas space by the declining surface of the coolant such as liquid helium, which causes insufficient cooling of the SQUID elements, or the coolant spills from the cryostat, which makes the measurement impossible.

Furthermore, a method solving the above-mentioned problem is disclosed on page 430 in Journal: Cryogenic Engineering, Vol. 28, No. 8 (1993). The SQUID elements in the cryostat for containing SQUID elements used in the method are cooled by a refrigerator. When the SQUID elements are cooled, an element supporting and cooling member made of solid material such as metal is cooled by the refrigerator, and the SQUID elements are cooled in a vacuum via the element supporting and cooling member.

However, since the SQUID elements are used to detect a very small quantity of magnetic flux, the element supporting and cooling member provided near the SQUID elements must be made of non-conductive material in order to prevent generation of eddy current due to the magnetic flux to be measured. Accordingly, the thermal conductivity of the non-conductive material is usually low. Moreover, the SQUID elements are detachably connected to the element supporting and cooling member by taking maintenance or exchange of the SQUID elements into consideration. Therefore, the SQUID elements are non-tightly attached to the element supporting and cooling member with screws, and the thermal conduction degree at the contact places between the member and each element cannot be uniformly controlled. Thus, temperature variance is caused among the cooled SQUID elements.

Furthermore, since the element supporting and cooling member and the SQUID elements are placed in a vacuum space, the member and the elements receive radiation heat from the parts of the structure surrounding the member and the elements, whose temperature is higher than that of the cooled member and elements. Further, since the quantity of the radiation heat transferred to the member and the element depends on the positional relation between the parts emitting radiation heat and the member or each element receiving the emitted radiation heat, a heat-receiving area in the member or each element, and so on, the variance is caused among quantities of heat received by the member and the elements. Accordingly, temperature variance is caused among the cooled SQUID elements. Since the sensitivity of a SQUID element is sensitive to its temperature, if there is temperature variance among the cooled SQUID elements, sensitivity variance is also caused among the cooled SQUID elements, which considerably degrades the accuracy in a measurement with the SQUID elements.

An object of the present invention is to provide a cryostat and a magnetism measurement apparatus using the cryostat which can secure the safety of a measured sample such as a human body even if a container in the cryostat should break down.

Another object of the present invention is to provide a cryostat and a magnetism measurement apparatus using the cryostat in which the evaporation amount of coolant to cool measurement elements such as SQUID elements is very small, and it is substantially unnecessary to supply the coolant.

Further, another object of the present invention is to provide a cryostat and a magnetism measurement apparatus using the cryostat in which cooled measurement elements such as SQUID elements can be declined toward a measured sample in all direction, that is, in the vertical, horizontal, or other declined directions.

Furthermore, another object of the present invention is to provide a cryostat and a magnetism measurement apparatus using the cryostat in which the required measurement accuracy is kept by uniformly cooling measurement elements such as SQUID elements.

Moreover, another object of the present invention is to provide a cryostat and a magnetism measurement apparatus using the cryostat in which the pressure in the cryostat does not increase beyond an the atmospheric pressure in a steady operation at a low temperature.

Additionally, another object of the present invention is to provide a cryostat and a magnetism measurement apparatus using the cryostat in which the evaporation amount of liquidized gas used for cooling coolant is reduced.

DISCLOSURE OF THE INVENTION

To attain the above objectives, the present invention provide a cryostat for containing SQUID elements in which the evaporation amount of coolant to cool the SQUID elements is very small, wherein fluid coolant is poured so as to soak at least a part, preferably, the whole of at least one cooled element, in the poured coolant, and the poured coolant is further cooled and solidified by a refrigerator. In accordance with the present invention, since coolant contacting the cooled element is solidified, the high safety is secured for a human body. Further, since the at least one SQUID element is unified along with the coolant by solidifying the coolant, the at lease one cooled element can be oriented in an optional direction along the shape of the measured sample.

Furthermore, the present invention provide a cryostat for containing SQUID elements in which the evaporation amount of coolant to cool the SQUID elements is very small, wherein a part of a very low temperature is thermally insulated with a thermal shield member cooled at the same temperature as that of the coolant. Thus, the amount of radiation heat transferred into the SQUID elements can be greatly reduced, which makes the temperature distribution in the SQUID elements uniform.

THE BEST MODE OF EMBODIMENTS

Hereafter, the embodiments of the present invention will be explained in detail with reference to the drawings.

Figure 1:
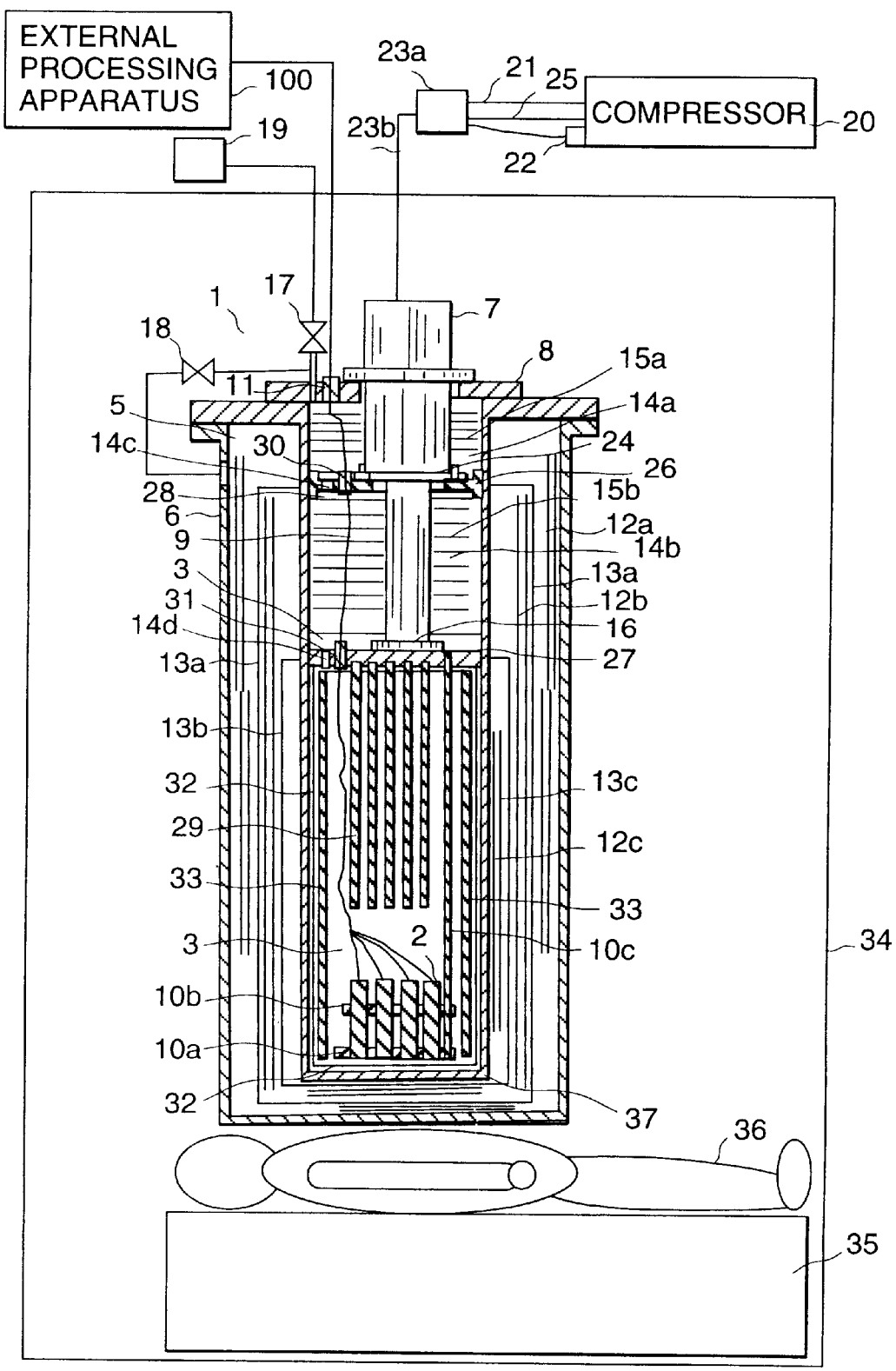
FIG. 1 is a vertical cross section showing the composition of a cryostat for containing SQUID elements of an embodiment according to the present invention.

FIG. 1 shows the composition of a cryostat for containing SQUID elements of an embodiment according to the present invention.

As shown in FIG. 1, the cryostat 1 for containing SQUID elements made of material such as NbTi, which turns to a superconducting state at the critical temperature of about less than 7 K (for example, 4.2 K for liquid helium at the atmospheric pressure), or material such as $YBa_2Cu_3O_7$, which turns to a superconducting state at the high critical temperature about less than 90 K (for example, 77 K for liquid nitrogen under the atmospheric pressure), an inner container 37 for containing coolant 3 which is in a fluid state before it is cooled, such as silicone oil of which the boiling point is more than 410 K under the atmospheric pressure, coolant 3 of which the boiling point is more than room temperature in atmospheric pressure, such as perfluorocarbon of which the boiling point is more than 313 K, or coolant 3 of which the boiling temperature is more than the temperature of the cooled SQUID elements 2, an outer container 6 for containing the inner container 37 and forming a thermal-shielding space 5, a refrigerator 7 such as a Slovay-type refrigerator, which is inserted into the top space of the inner container 37, a flange 8 for shielding the inner container 37 from the outside air, measurement lead-out wires 9 for sustaining the SQUID elements 2 and leading measurement current from the SQUID elements 2 to the outside of the cryostat 1 for containing the SQUID elements 2, and support mechanisms 10a, 10b, and 10c for supporting the SQUID elements 2 by passing each element through each of holes formed in the respective support mechanisms 10a, 10b, and 10c. Also, the inner container 37 is air-tightly separated from the outside air. Numeral 11 indicates an exit hole for leading out the measurement lead-out wires 9 to the outside, and the inner and outer containers 37 and 6 are made of non-conductive and non-magnetic material such as glass epoxy resin in order to prevent generation of eddy current due to magnetic flux to be measured. Moreover, the measurement lead-out wires 9 are connected to an external processing apparatus 100 for processing measurement signals. Further, thermometers such as thermocouples (not shown in figures) are provided in the SQUID elements 2, and the detected temperature signal of each SQUID element is sent to the external processing apparatus 100. Furthermore, the detected temperature signals of the SQUID elements 2 are processed by the external processing apparatus 100, and the external processing 100 monitors the cooling processing of the SQUID elements 2, for example, to determine the time point when the SQUID elements 2 is cooled to the critical temperature, and turns to the superconducting state. The reason why the temperature distribution is monitored is that temperature characteristics of SQUID elements are usually different from each other, and the levels of signals output from the SQUID elements indicate different values to the same magnetic flux if the temperature of the SQUID elements differ from each other. Therefore, by measuring the temperature characteristics of the SQUID elements in advance, measured values sent from the SQUID elements are corrected with the information on the temperature characteristics of the SQUID elements when the magnetic flux from a measured sample is measured. In addition to the thermocouples, heating means are provided in the SQUID elements (not shown in figures), and wires for the heating means are connected to the external processing apparatus 100 as well as the measurement lead-out wires 9. By an erroneous operation such as opening of the magnetic shield wall 34 during the measurements, strong magnetic flux may enters some of the SQUID elements 2 in a superconducting state and is trapped in them. Consequently, even if the magnetic flux of the measured sample is removed, the trapped magnetic flux remains in the SQUID elements, which makes the measurement of a very small quantity of magnetic flux impossible. If this problem occurs, only SQUID elements trapping magnetic flux are heated with the above heating means, and are returned to a normal conducting state to extinguish the trapped magnetic flux. Afterward, by cooling the elements to turns to a superconducting state again, the measurement of a very small quantity of magnetic flux becomes possible again. In this heating process, since a thirty-plus-degrees increase in the temperature of the elements is sufficient, the refrigerator 7 continues to be operated, the problem elements is heated by a necessary quantity of increase in their temperature while the elements other than the problem elements remain cooled. According to this heating process, since only a very local change of the temperature distribution in the SQUID elements occurs due to thermal resistance of thermal conduction substances around each of the problem elements, the temperature in only each of the problem elements and a part very near the element increase. Thus, heating and re-cooling of the problem elements can be efficiently performed.

In the thermal shield space 5, members 12a, 12b, and 12c laminated with aluminum-deposition film, and thermal shield members 13a and 13b, which are composed of tablet shaped plates or enameled wires of a small diameter, are provided surrounding the inner container 37. The respective thermal shield members 13a and 13b are connected to the outer surface of the wall of the inner container 37 of which temperature is less than the predetermined temperature, for example, 50 K or 7 K, so that the temperature of these members 13a and 13b is equal to that of the wall of the inner container 37 (hereafter, referred to as "in a thermally united structure").

In the upper thermal shield spaces 14a and 14b of the thermal shield space 5, thermal shield members 15a and 15b laminated with aluminum deposition-film are arranged to shield the radiation heat from the flange 8 of the normal temperature.

In the following, a cooling method of the SQUID elements 2 will be explained with reference to FIG. 1. The coolant 3 is poured into the inner container 37 when the SQUID elements 2 are installed in the inner container 37, or before the SQUID elements 2 are cooled, and the SQUID elements 2 are soaked in the coolant 3. In this embodiment, the surface of the coolant 3 is positioned at a level such that a part of the second cooling stage 16 in the refrigerator 7 is soaked in the coolant 3.

At first, valves 17 and 18 are opened, and the inner container 37 and the thermal shield space 5 is evacuated with the vacuum pump 19. The inside pressure of the inner container 37 becomes uniform via ventilation holes 14c and 14d. Next, the refrigerator 7 is started. Helium gas which is highly pressurized by the helium compressor 20 is fed to the refrigerator 7 from a pipe 21 via a flow-path switching device 23a controlled by a valve-switching-period adjusting device 22. The highly pressurized helium is adiabatically expanded in the refrigerator 7, and the refrigerator 7 cools the first and second fooling stages 24 and 16. The expanded and decompressed helium gas passes through a pipe 23b and the flow-path switching device 23a, and is returned to the compressor 20 via a pipe 25. Just after the refrigerator 7 is started, the first and second cooling stages 24 and 16 begin to be gradually cooled. Further, a cooling plate 26 connected to the first cooling stage 24 in a thermally united structure is cooled to about 50 K, and a cooling plate 27 connected to the second cooling stage 16 in a thermally united structure is cooled to about 7 K. The cooling plates 26 and 27 are made of non-magnetic materiel with a high-thermal conductivity, such as aluminum, copper, sapphires, etc.

At the peripheral part of the cooling plate 26, contact-holding material such as silicone grease is applied in order to maintain a good thermal contact between the cooling plate 26 and the inner container 37. Moreover, a brim is provided at the peripheral part of the cooling plate 26 so as to increase a contact area between the inner container 37 and the brim part 28, which improves the thermal conduction between the inner container 37 and the cooling plate 26. Further, an attachment part of the thermal shield member 13a, which is connected to the outer surface of the wall of the inner container 37 at the brim part 28 in a thermally united structure, is cooled to about 50 K so that the whole of the thermal shield member 13a is cooled.

On the other hand, there exists a part of the poured coolant 3 in a gap between the peripheral part of the cooling plate 27 and the inner container 37, which maintain a good thermal contact, and an attachment part of the thermal shield member 13b, which is connected to the outer surface of the wall of the inner container 37 at the gap in a thermally united structure, is cooled to less than about 7 K so that the whole of the thermal shield member 13b is cooled.

Further, the thermal conduction members 29 are connected to the back face of the cooling plate 27 in a thermally united structure, for example, of which one end side surface is soldered to the back face of the cooling plate 27, and are arranged at a place such that eddy current is not easily generated. Thus, the coolant 3 is cooled to less than about 7 K by the thermal conduction members 29. Here, the thermal conduction members 29 are made of non-magnetic material with a high thermal conductivity, such as aluminum, copper, sapphires, etc. Also, each of the thermal conduction members 29 is fabricated into a shape such that eddy current is hardly generated on the thermal conduction member. For example, each of the thermal conduction members 29 is composed of a bundle of a plurality of enameled copper wires. Therefore, since all of the SQUID elements soaked in the coolant 3 contact the coolant 3, there is scarcely thermal resistance between the SQUID elements 2 and the coolant 3, and the SQUID elements are uniformly cooled to less than abut 7 K.

Thus, since a part of the inner container 37 lower than the cooling plate 27 is surrounded by the thermal shield member 13b cooled to less than about 7 K, the radiation heat transferred from the outside is little, and the heat conducting from parts of the normal temperature via the wall of the inner container 37 is also little because the wall of the inner container 37 is cooled by the cooling plate 27. Further, the heat conducting from parts of the normal temperature via the measurement lead-out wires 9 is little because the measurement lead-out wires 9 are connected to the cooling plate 26 and a shielding member 30, and the cooling plate 27 and a shielding member 31 in a thermally united structure, and these plates 26 and 27, and members 30 and 31 are cooled to less than about 50 K and about 7 K, respectively. Therefore, the part of the coolant 3 and the SQUID elements 2 lower than the cooling plate 27 are uniformly cooled to the predetermined temperature, which improves the measurement performance of the group of the SQUID elements.

Moreover, a thermal conduction member 32 composed of copper tablet plates or copper wires coated with electrically insulating material is connected to the cooling plate 27 in a thermally united structure, and the inside surface of the inner container 4 is covered with the thermal conduction member 32. Accordingly, even if the temperature of the thermal shield member 13b should be increased by the radiation heat, since the heat transferred to the thermal shield member 13 is absorbed by the thermal conducting member 32, and an increase of the temperature in the SQUID elements 2 can be prevented, the uniform temperature of the coolant 3 around the SQUID elements 2 can be maintained. Thus, the temperature of the SQUID elements 2 can be maintained uniform, which improves the measurement performance of the SQUID elements 2.

When the temperature of the first cooling stage 24 or the second cooling stage 16 decreases below 70 K, substances remaining in the inner container 37, such as moisture, carbonic acid gas, and so on are trapped on the surface of each stage, and the pressure in the inner container 37 begins to decrease by a cryopump-effect. Accordingly, a valve 17 is closed, and a vacuum pump 19 is stopped. In this procedure, a valve 18 can be left open. Further, when the temperature of the second cooling stage 16 decreases below 20 K, gas with a constant boiling point which is remaining in the inner container 37, such as remaining air, is trapped on the surface of the second cooling stage 16 by a cryopump-effect, the inside of the inner container 37 becomes highly vacuous. However, silicone oil keeping fluidity at the normal temperature or paraffin keeping fluidity at several-ten degrees centigrade (less than 100° C.) scarcely vaporizes even in a highly vacuous environment.

Also, displacement absorption members 33 are arranged near the inside wall of the lower part in the inner container 37, which is composed of substances absorbing a volume expansion of coolant or internal members, such as foam styrole pieces, foam urethane pieces, air bags of an air pillow style, etc., or made of material including substances with a coefficient of volume expansion smaller than that of the solidified coolant 3. Therefore, the displacement due to a volume expansion caused when the coolant 3 is cooled and solidified is absorbed by the above displacement absorption members 33, which prevents a breakdown of the SQUID elements 2 or the inner container 37.

Gas such as air, butane gas, carbonic acid gas, etc., contained cells in the displacement absorption member 33 made of foam styrole, foam urethane, and the like, is hardly released even when the inner container 37 is evacuated at the normal temperature because walls of the cells in the member 33 possesses hard stiffness. Further, since the coolant 3 also performs a role of airtight seal matter, the gas is more hardly released, and does not obstruct the evacuation of the inner container 37. Moreover, since the gas contained in the cells in the displacement absorption members 33 is also solidified during the cooling process, and the insides of the cells become vacuous, the displacement absorption members 33 also perform a role of a heat insulating member, which prevents heat from flowing into the SQUID elements 2. Furthermore, since the coolant 3 sinks into only the surface part of the displacement absorption members 33, the displacement due to the volume expansion of the solidified coolant 3 can be absorbed by deformation of the evacuated cells in the displacement absorption members 33. Even if a part of the walls of the cells are broken down in the deformation, since the gas in the cell has been already solidified, and the temperature of the coolant 3 is lower than that of the solidified gas, the degree of vacuum in the inner container 37 is not deteriorated. Although the displacement absorption member 33 is arranged along the inside wall of the inner container 37, the member 33 can be also arranged another place in the coolant 3, the place being suitable for absorbing the displacement due to the volume expansion of the coolant 3.

When the group of the SQUID element 2 is cooled to the predetermined temperature, the preparation of measurement is completed, and the group of the SQUID element 2 begins to measure the magnetic flux of a very low level, generated by a measured human body 36 laid on a bed 35 provided in the magnetic shield wall 34. During the several minutes of the measurement, the operation of the refrigerator 7 is temporarily stopped to avoid effects of vibration due to the operation of the refrigerator 7, which can also improves the measurement accuracy. After the measurement is finished, the refrigerator 7 is restarted. The stopping of the refrigerator 7 can be carried out only by stopping the operation of the flow path switching device 23.

Even if the cryostat 1 for containing the SQUID elements 2 is declined or inverted, since the coolant 3 is solidified, the cooling of the SQUID element 2 is not affected by declining or inverting of the cryostat 1, and the measurement is also possible. Moreover, if wax such as paraffin is used as the coolant 3, the wax is heated and fluidized with a heater or dryer in another container (not shown in figures), and volatile substances or air in the wax is removed by vacuously degassing the wax in the container. Further, the fluidized and degassed wax is poured into the inner container 37, and after the air mixed in the wax when the wax has been poured in to the inner container 37 is degassed, the wax is solidified by leaving the wax in an environment of the normal temperature. Thus, even if the inner container 37 is declined or inverted at the normal temperature, the coolant 3 does not move, and it becomes possible to transport in an optional attitude, which make it easier to transport or move the cryostat 1 for containing the SQUID elements 2.

Furthermore, since the equality between the pressure inside and outside the inner container 37 can be maintained in this embodiment, it is not necessary to use a pressure vessel as the inner container 4, and a thin wall and a thin bottom plate can be used for the inner container 37. By using a thin wall or plate, the amount of heat transferred from the wall and the bottom plate can be decreased, and the cooling capacity of the refrigerator 7 can be also reduced, which can decrease the size of the refrigerator 7 and its power consumption. Moreover, by using a thin bottom plate, the group of the SQUID element can be arranged closer to a magnetic flux generating source of the measured human body 36, which further improves the measurement accuracy.

Moreover, if material with a low saturation vapor pressure is used as the coolant 3, vapor scarcely generates from the coolant 3, and the structural members arranged in thermal shield space 5 are not contaminated with vapor from the coolant 3. Therefore, since the degradation of the surface reflectivity due to the surface contamination of the structural members is small, the high thermal shielding performance can be maintained.

Although the group of the SQUID elements 2 is vertically arranged in parallel to the gravity direction, the group of the SQUID elements 2 can be arranged in a declined attitude or in the horizontal direction in the inner container 37.

Also, if an evacuating component for the thermal shield space 5 positioned near the valve 18 is removed, and a penetration hole communicating with the thermal shield space 5 is formed at the upper wall of the inner container, it can bring about the similar effects to those of the above example of using the material with the low saturation vapor pressure.

Here, it is sufficient to position the surface of the coolant 3 at a level such that all the thermal conducting members 29 contact the coolant 3, and the group of the SQUID elements 2 is soaked under the surface of the coolant 3. Further, the cooling plate 27 is connected to the inner container 4 in a thermally united structure via material such as silicone grease.

Moreover, the displacement absorption members 33 can be arranged outside the thermal conduction member 32.

In order to increase the thermal conductivity of the coolant, substances with a thermal conductivity larger than that of the coolant 3 are mixed into the coolant 3, the following substances being effective as the above mixed substances, that is: solder particles, very small aluminum particles, electrically non-conductive ceramic particles, long fibers, short fibers, copper fibers, copper balls in which gas with a specific heat larger than that of the coolant, for example, helium gas, nitrogen gas, and so on is contained and shield, thin tubes in which helium gas, nitrogen gas, etc., is contained and shield, and the like. Thus, the cooling speed of the coolant 3 is increased, or the increase of the heat capacitance of the coolant 3 at the very low temperature can reduce the change of the temperature in the group of the SQUID elements 2 during stopping for a comparatively short time of the refrigerator 7. If the mixed substances is electrically conductive, it is preferable that generation of eddy current causing measurement noises is prevented by coating the surface of each mixed substance with enamel coating material. In another example of this embodiment, wax such as paraffin is used as the coolant 3, and electrically non-conductive substances are uniformly mixed into the wax fluidized by heating. Further, the fluidized wax mixed with the non-conductive substances are poured into a predetermined space in the cryostat for containing the SQUID elements 2. Furthermore, the wax is vacuously degassed, and is cooled and solidified in the air by heat-radiation. After the solidification of the wax, since the distribution of the thermal conductivity in the wax mixed with the electrically non-conductive substances is uniform, and does not change in time, the wax, that is, the coolant 3, is uniformly cooled, which can uniformly cool the group of the SQUID elements 2.

As the refrigerator 36, a refrigerator using helium, nitrogen, air, hydrogen, flon gas, etc., or an electric refrigerator using Peltier elements, can be used. Also, as a refrigerating apparatus using gas as a refrigerating medium, a pulse type, a Gifford-MacMahon type, a Solvay type, and a Stirling type refrigerating apparatus, a Collins type expander, a turbine type expander, an expansion valve type refrigerating apparatus, and so on, and a combination of these refrigerating apparatuses can be used.

When the SQUID elements 2 are taken out to the air for their repair or exchange, the inside of the inner container 4 is heated to the normal temperature by stopping the refrigerating operation or inverting the operational cycle of the refrigerator 7. Afterward, air or dry nitrogen is injected into the inner container 4 to increase the pressure in the inner container to the atmospheric pressure, and the structural members under the flange 8 are taken out of the inner container 4. Thus, the SQUID elements 2 can be repaired or exchanged.

If liquid whose boiling point is higher than the temperature of the cooled SQUID elements, for example, liquid nitrogen or liquid argon, is used as the coolant 3, at first the valves 17 and 18 are opened, and the inner container 37 and the thermal shield space 5 are evacuated with the vacuum pump 19. Next, after the valve 18 is closed, and the vacuum pump 19 is stopped, the coolant 3 is poured into the inner contained 37 at the atmospheric pressure, and is cooled with the refrigerator 7 while the surface of the coolant 3 is maintained at a constant level. After the temperature of the coolant 3 reaches the freezing point, the valve 17 is closed. The subsequent operational procedures are similar to the cooling operation using liquid helium as the coolant 3. However, for the safety, it is necessary to provide a safety valve (not shown in FIG. 1) communicating with the inside of the inner container 37 at the flange 8.

Figure 2:
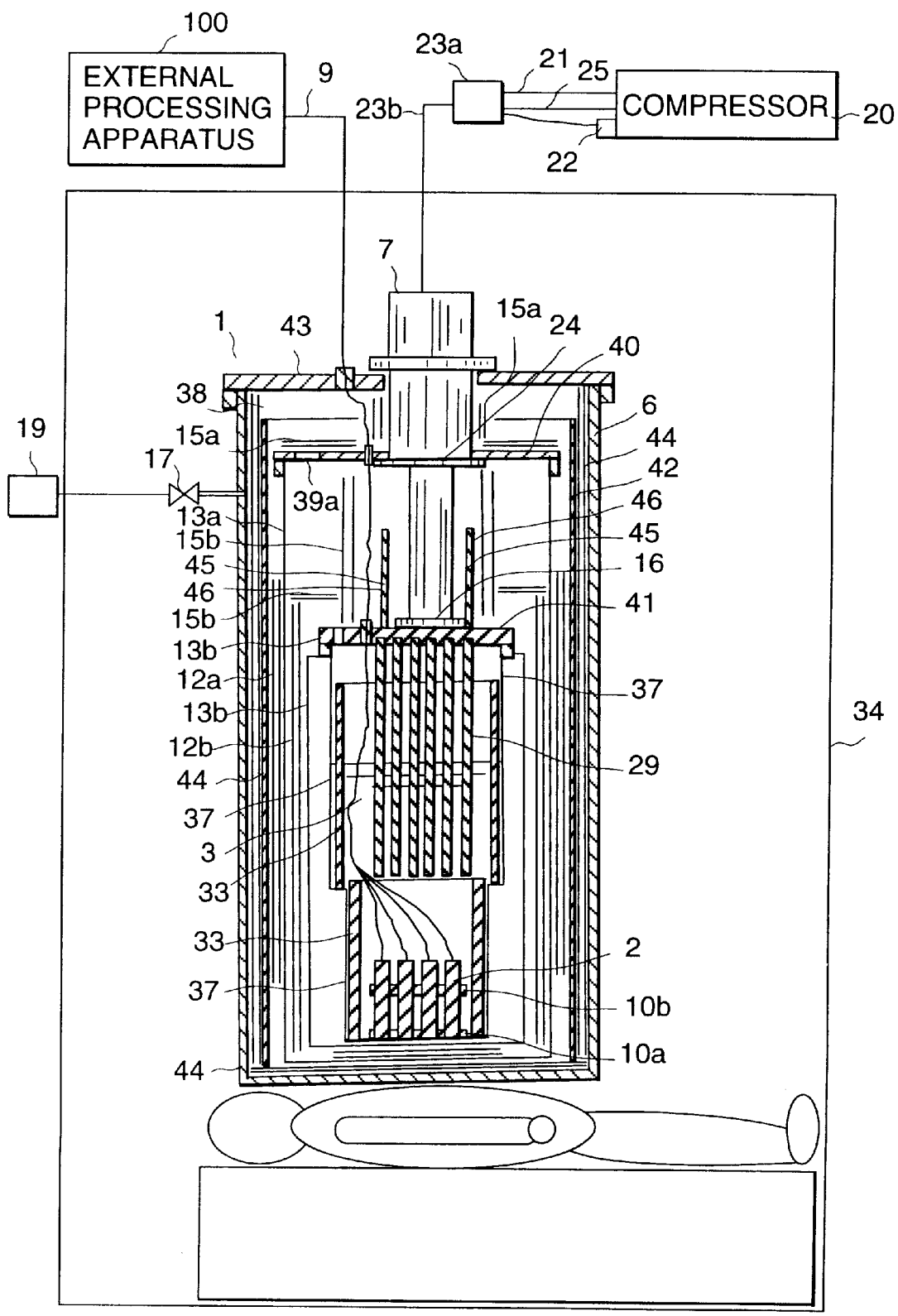
FIG. 2 is a vertical cross section showing the composition of a cryostat for containing SQUID elements of another embodiment according to the present invention.

FIG. 2 shows the composition of a cryostat of another embodiment according to the present invention. In this embodiment, the coolant 3 is poured into the inner container 37 by a predetermined amount when the SQUID elements 2 are installed, or before the coolant is cooled, and the SQUID elements 2 is soaked in the coolant 3 poured into the small transparent inner container 37 with a thin thickness, for example, made of perfluorocarbon. In order to improve the efficiency of cooling the inside of the inner container 37, a thermal conduction member (not shown in this figure) is attached on the outside surface of the inner container 37 in a thermally united structure, which makes the heat conduction in the vertical direction easier.

At first, the valve 17 is opened, and the small inner container 37 and the thermal shield space 38 are evacuated with the vacuum pump 19. The inside of the inner container 37 is evacuated via ventilation holes 39a and 39b. Next, the refrigerator 7 is started, and the first and second cooling stages 24 and 16 are cooled by the refrigerator 7. Further, cooling plates 40 and 41 which are connected to the first and second cooling stages 24 and 16 in a thermally united structure, respectively, are cooled to about 50 K and less than about 7 K, respectively. Here, the cooling plates 40 and 41 are made of non-magnetic material with a high thermal conductivity, such as aluminum, copper, electrically non-conductive material such as sapphires, ceramics, and so on.

The thermal shield member 13a is connected to the peripheral part of the cooling plate 40 in a thermally united structure, and the connection part is cooled to about 50 K with the cooling stage 24 to cool the whole of the thermal shield member 13a.

Further, the thermal conduction members 29 is connected to the back part of the cooling plate 41 in a thermally united structure, and the coolant 3 is cooled to less than about 7 K by the thermal conduction members 29. Therefore, since the whole of the SQUID elements 2 soaked in the coolant 3 contacts the coolant, there is little thermal resistance between the thermal conduction members 29 and the SQUID elements 2, and the SQUID elements 2 are uniformly cooled to less than about 7 K. Also, the dislocation absorption members 33 are arranged near the inside wall of the lower part of the inner container 37.

A cylinder 42 with the stiffness such that the cylinder 42 can maintain the cylindrical shape, made of non-magnetic and electrically non-conductive material such as perfluorocarbon, aluminum film being deposited on the inside and outside surfaces of the cylinder 42, is arranged in the thermal shield space 5 inside the outer container 6, and used for a guide tube when the inner container 37 directly or indirectly connected to the flange 43 is inserted into or taken out of the outer container 6. Moreover, laminated thermal shield film 44 is attached on the outside surface and the bottom face of the cylinder 42.

Furthermore, a non-magnetic and electrically non-conductive thermal conduction member 45 with a high thermal conductivity is connected onto the top face of the cooling plate 41 in a thermally united structure, and a gas absorption substance 46 such as active carbon is deposited on the outer surface of the thermal conduction member 45 in a thermally united structure, which is cooled to the temperature of the cooling plate 41. The gas absorption substance 46 absorbs gas remaining in the thermal shield space 5 or gas generating from surfaces of the structural members, opposite to the thermal shield space 5, which can improve the degree of vacuum and the thermal shield performance of the thermal shield space 5.

Since the lower part of the inner container 37 below the cooling plate 41 is surrounded by the thermal shield member 13b cooled to less than about 7 K, radiation heat is not transferred from the outside into the lower part of the inner container 37, and since the inner container 37 is sustained by the lower part of the refrigerator 7, heat does not conduct from parts of the normal temperature into the inner container 37. Therefore, the amount of heat entering into the inner container 37 is further reduced, and the whole coolant 3 below the cooling plate 41 is also further uniformly cooled. Thus, the measurement sensitivity of each SQUID element is raised, which can improve the measurement performance of the group of the SQUID elements 2.

Figure 3:
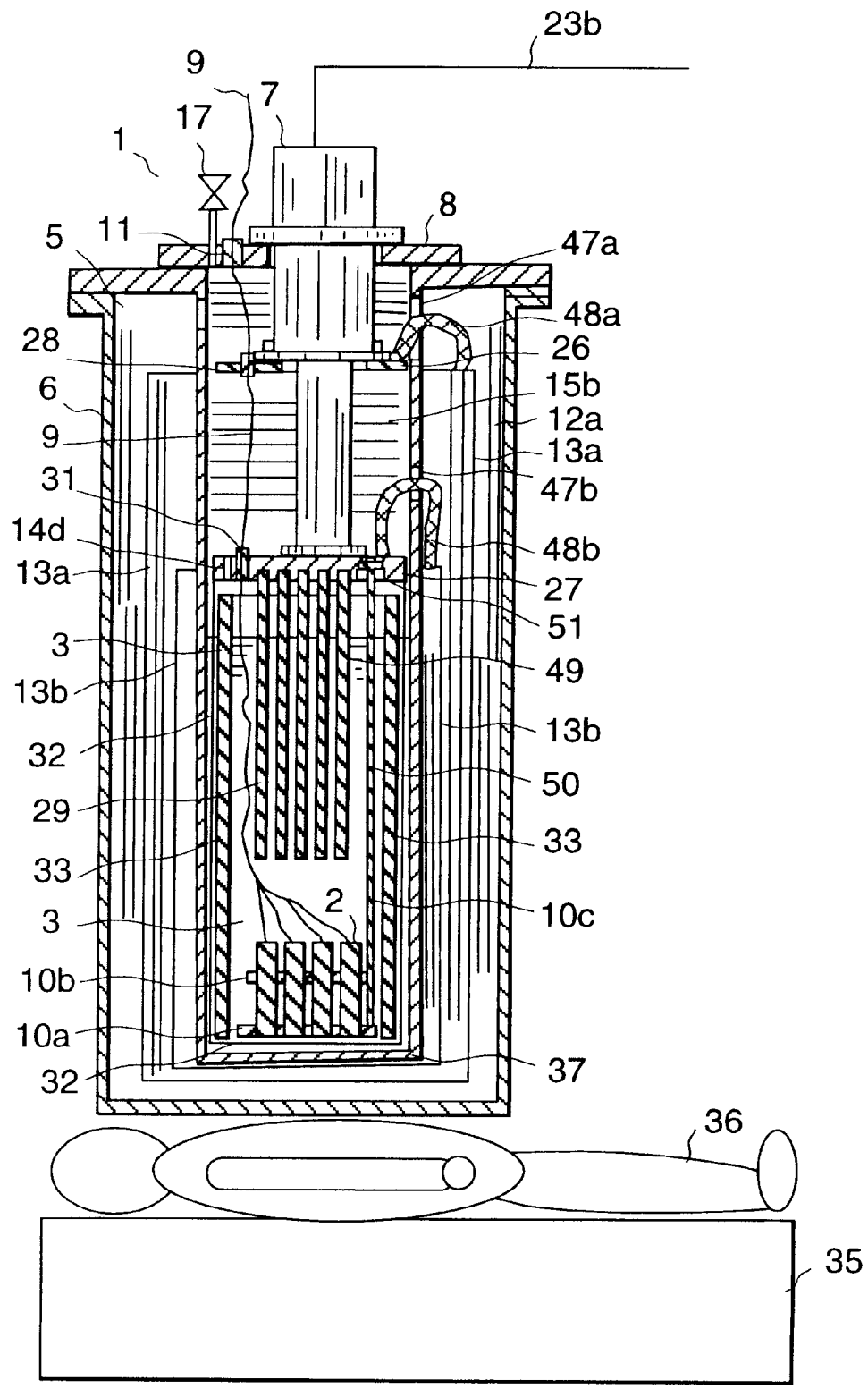
FIG. 3 is a vertical cross section showing the composition of a cryostat for containing SQUID elements of another embodiment according to the present invention.

FIG. 3 shows the composition of a cryostat of another embodiment according to the present invention. This embodiment differs from the embodiment shown in FIG. 1 in a point that holes 47a and 47b communicating the inside of the inner container 37 and the thermal shield space 5 are additionally provided, and the thermal shield members 13a and 13b are cooled to less than about 50 k and about 7 K by the cooling plates 26 and 27, respectively, via thermal conduction members 48a and 48b such as enamel-coated copper nets, which can be flexibly bent, in a point that the thermal conduction members 49 and 32 are made of a thermal conduction substance such as enamel-coated copper nets, which can be flexibly bent, in a point that a displacement absorption part 51 is provided at the connection part between the supporting member 50 and the cooling plate 27, and in a point that the surface of the coolant 3 is maintained at a level lower than that of the cooling plate 27.

According to the above composition, the thermal shield member 13a can be well cooled by the cooling plate 26 without applying silicone grease to the outer peripheral part of the cooling plate 26 to maintain the good thermal contact with the inner container 4 and without maintaining the surface of the coolant 3 at a level higher than that of the cooling plate 27. Therefore, it is solved that the cooling plates 26 and 27 are fastened to the inner wall of the inner container 4 with the solidification of silicone grease or the coolant 3, which prevents the thermal stress due to the difference between the shrinking quantity of the cooling plate 26 or 27 and that of the inner wall of the inner container 37, and suppresses an excessive load generated at parts composing the refrigerating mechanism. Thus, the reliability of the refrigerator 7 can be improved.

By making the thermal conduction members 49 and 32 composed of a thermal conduction substance such as enamel-coated copper nets, which can be flexibly bent, and providing a displacement absorption part 51 at the connection part between the supporting member 50 and the cooling plate 27, the members 49 and 32, and the absorption part 51 can absorb the relative displacements between the cooling plate 27 and the solidified coolant 3 after the coolant 3 is solidified, which can remove the constrained displacement at the refrigerator 7, and also prevent the vibration due to operations of the operating refrigerator 7 from transferring to the SQUID elements 2 via the coolant 3. Thus, according to the above composition, the reliability of the refrigerator 7 and the measurement accuracy of the SQUID elements 2 during operation of the refrigerator 7 can be improved.

Figure 4:
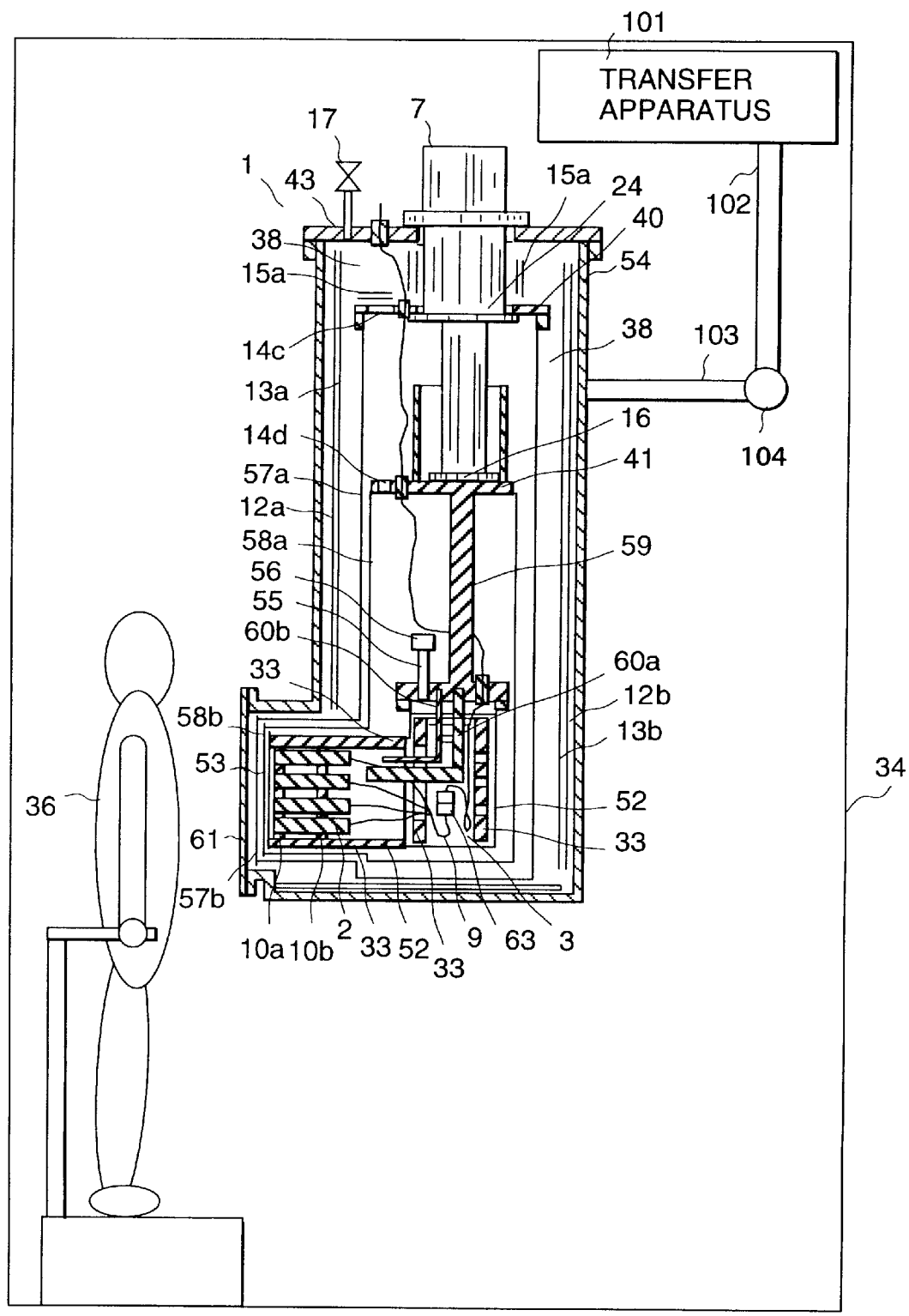
FIG. 4 is a vertical cross section showing the composition of a cryostat for containing SQUID elements of another embodiment according to the present invention.

FIG. 4 shows the composition of a cryostat of another embodiment according to the present invention. In this embodiment, when the SQUID elements 2 are installed in the inner container 52, or before the coolant 3 is cooled, a predetermined amount of the coolant 3 is poured into the inner container 52, and the SQUID elements 2 are soaked in the coolant 3 in the small thin inner container 52 with a vertical cross section of an L-letter shape, made of epoxy resin including glass fibers. Further, thermal conduction members (not shown in this figure) are connected to the outer surface of the inner container 52 in a thermally united structure to make it easier heat transfer between the upper and lower parts of the inner container 52. Also, a thin flange 53 is provided at the left end side of the inner container 52 in this figure, and the inner container 52 can be opened to the air at the normal temperature by opening the flange 53.

At first, the valve 17 is opened, and the thermal shield space 38 inside the outer container 54 with a vertical cross section of an L-letter shape and the small inner container 52 are evacuated with the vacuum pump 19. The inside of the inner container 52 is evacuated via a ventilating tube 55 and a coolant-vapor-mist separator 56. The separator 56 prevents vapor mists of the coolant 3 from being exhausted out of the inner container 52, and contaminating the surface of the thermal shield films 15a.

Next, the refrigerator 7 is started, and the first and second cooling stages 24 and 16 are cooled. The cooling plate 40 connected to the first cooling stage 24 in a thermally united structure is cooled to about 50 K, and the cooling plate 41 connected to the second cooling stage 16 in a thermally united structure is cooled to less than about 7 K. The cooling plates 40 and 41 are made of non-magnetic material with a high thermal conductivity, such as aluminum or copper, or electrically non-conductive material such as sapphires, ceramics, and so on.

Further, a thermal shield plate 57a is connected to the peripheral part of the cooling plate 40 in a thermally united structure, and the whole thermal shield plate 57a and a thin flange 57b provided at the left end side of the thermal shield plate 57a in this figure are cooled by cooling the connection part between the plates 40 and 57a with the first cooling stage 24. The space surrounded by the thermal shield plate 57a can be opened to the air at the normal temperature by opening the flange 57b.

Furthermore, a thermal shield plate 58a is connected to the peripheral part of the cooling plate 41 in a thermally united structure, and the whole thermal shield plate 58a and a thin flange 58b provided at the left end side of the thermal shield plate 58a in this figure are cooled by cooling the connection part between the plates 41 and 58a with the second cooling stage 16. Also, the space surrounded by the thermal shield plate 58a can be opened to the air at the normal temperature by opening the flange 58b.

Moreover, a thermal conduction member 59, which is made of non-magnetic material with a high thermal conductivity, such as aluminum or copper, or electrically non-conductive material such as sapphires, ceramics, and so on, is connected to the back part of the cooling plate 41 in a thermally united structure, and the inner container 52 is suspended from the bottom part of the thermal conduction member 59. Also, thermal conduction members 60a and 60b of an L-letter shape, which is made of non-magnetic material with a high thermal conductivity, such as aluminum or copper, or electrically non-conductive material such as sapphires, ceramics, and so on, is connected to the thermal conduction member 59 in a thermally united structure. The coolant 3 in the inner container 52 is uniformly cooled to less than about 7 K by the thermal conduction members 60a and 60b. Therefore, since the whole of the SQUID elements 2 soaked in the coolant 3 contacts the coolant 3, there is little thermal resistance between the thermal conduction member 60a or 60b, and the SQUID elements 2, and the SQUID elements 2 are uniformly cooled to less than about 7 K. Also, the dislocation absorption members 33 are arranged near the inside wall of the lower part in the inner container 52.

A flange 61 is provided at the left end side of the outer containment 54, and the outer container 54 can be opened to the air at the normal temperature by opening the flange 61. Also, the cryostat 1 for containing the SQUID elements 2 can be moved in an optional direction by a transfer apparatus 101 including arms 102 and 103, and a joint 104 which can rotate the arm 103 in any direction. Another end side of the arm 103 is connected to the cryostat 1 for containing the SQUID elements 2. The 103 can be three-dimensionally rotated in the vertical direction and the horizontal direction. Further, the measured human 36 can adjust his position while the human 36 is standing. Therefore, the group of the SQUID elements 2 can be quickly positioned at the front, the back, or the side of a heart of the measured human 36, or the head of the measured human 36 by the transfer apparatus 101. Furthermore, when the measured part of the measured human 36 is measured in the multi-directions with a plurality of cryostats 1 for containing the SQUID elements 2, the measurement place at which each cryostats 1 for containing the SQUID elements 2 is positioned can be easily controlled by the transfer apparatus for each cryostat 1.

According to this embodiment, since the refrigerator 7 can be placed in the vertical direction in which the refrigerator 7 can function with its maximum performance, that is, in the direction in which its low-temperature part is positioned at a low level, and its high-temperature part is positioned at a high level, and the measurement direction of the group of the SQUID elements 2 can be set in the horizontal direction, the magnetic flux generated from the heart can be measured while the measured human 36 is standing. Thus, since the time necessary from the positioning of the cryostat 1 and the measured human 36 to the completion of the measurement carried out for the standing human 36 is shorter than that carried out for the laid human 36, the measurement time can be greatly reduced.

In this embodiment, if some of the SQUID elements 2 are to be exchanged during maintenance of the cryostat 1 for containing the SQUID elements 2, the temperature of the whole cryostat 1 is turned to the normal temperature, and the cryostat 1 is declined so that the group of the SQUID elements 2 is faced upward. Further, the valve 17 is opened to turn the inside pressure to the atmospheric pressure, and the flanges 61, 58b, and 57b are opened. Meanwhile, The group of the SQUID elements 2 is fixed to the flange 57b with screws. Furthermore, the group of the SQUID elements 2 is taken out of the inner container 52 along with the support mechanisms 10a and 10b for supporting the SQUID elements 2 in the holes provided in each support mechanism, the measurement lead-out wires 9, and the detachable connector 63. The group of the SQUID elements 2 is released by detaching the connector 63 from the group of the SQUID elements 2, and is exchanged with a new group of SQUID elements 2. Afterward, these components are reassembled to turn the inside composition of the inner container 52 to the ordinary composition, and the cryostat 1 for containing the SQUID elements 2 is again operated. Therefore, according to this embodiment, since flanges for opening the inside of the inner container 52 to the air can be provided in the measurement direction of the group of the SQUID elements 2, it is not necessary to take the group of the SQUID elements 2 out of the inner container 52 by opening the flange 43, for exchanging of the group of the SQUID elements 2, which can reduce the time necessary for the exchanging of the SQUID elements 2. Moreover, since there is little pressure difference between the inside and the outside of each cylinder, the pressing force such that the coolant 3 does not leak from the attachment part is sufficient for attaching the flanges 58b and 57b to the respective cylinders 58a and 57a.

Further, in this embodiment, when the thermal shield space 38 inside the outer container 54 of an L-letter shape, and the inner container 52 are evacuated by opening the valve 17 and operating the vacuum pump 19, even if there are spaces in which air stagnates, the air stagnating in the spaces can be expelled by the evacuation process, and the coolant 3 enters the spaces in turn. Accordingly, the air remaining in the coolant 3 is almost completely exhausted, which contributes to uniform cooling of the SQUID elements 2.

Furthermore, the cross section area of the thermal conduction member 60a arranged at the central position in the inner container 52 is larger than that of the thermal conduction member 60b, which makes the amount of heat transferred by the member 60a larger than that transferred by the member 60b. By the above composition, the coolant 3 in the inner container 52 begins to be solidified from the central region, and the solidified part growths outward, which can reduce the relative thermal deformation difference between the outer region and the inner region. Thus, by solidifying the coolant 3 around the respective SQUID elements 2 from the central region, it is possible to prevent the SQUID elements 2 from breaking down, which is due to thermal deformation.

In addition, by declining another cryostat 1 for containing the SQUID elements 2 according to this embodiment so as to measure the magnetic flux generated from the heart from the back side of the measured human 36, the magnetic flux generated from the heat of the measured human 36 laid on its back can be measured from above and below at the same time, which can realize a more accurate and wider measurement. Thus, the magnetic flux distribution can be measured in more detailed.

Also, since the length of the horizontal part of the inner container 52 is comparatively short, the shrinking amount of the horizontal part due to decrease from the normal temperature to the very low temperature is small. Accordingly, the interval between the outer face of the flange 61 and the SQUID elements 2 very slightly increases when the whole cryostat 1 is cooled to a very low temperature. Therefore, the interval between the heart of the measured human 36 and the SQUID elements 2 also very slightly increases, which further improves the measurement accuracy in comparison with that of a conventional measurement apparatus.

On top of that, since there is not a pressure difference between the inside and outside of the inner container 52, the horizontal cross section of the inner container 52 of an L-letter shape can be fabricated as a rectangular, and a thin plate can be used for the wall of the inner container 52, which can reduce the production cost of the inner container 52.

Figure 5:
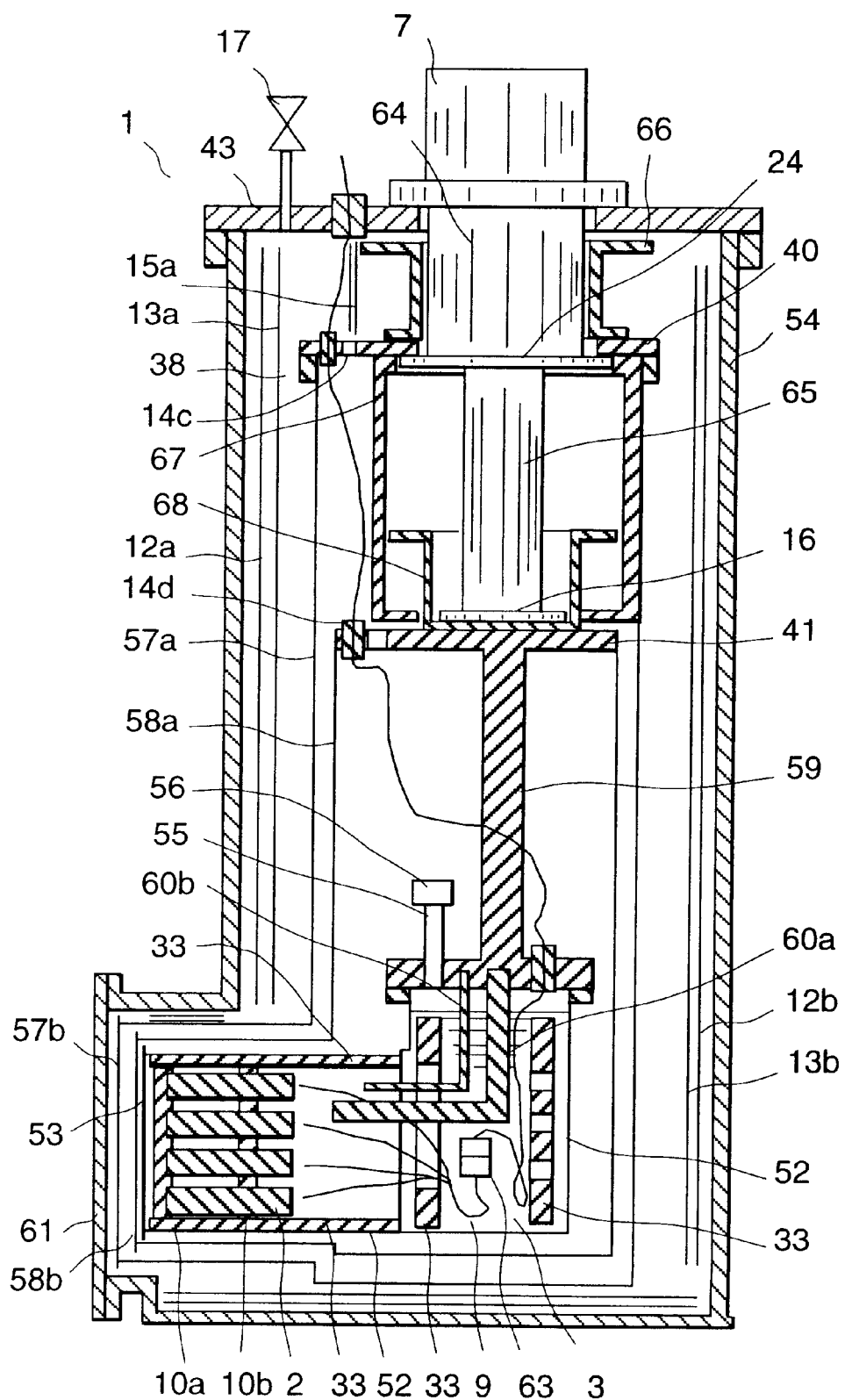
FIG. 5 is a vertical cross section showing the composition of a cryostat for containing SQUID elements of another embodiment according to the present invention.

FIG. 5 shows the composition of a cryostat of another embodiment according to the present invention. In this embodiment, magnetic shield members 66, 67, and 68 made of material such as $YBa_2Cu_3O_7$ are arranged around the respective cylinders 64 and 65 of the refrigerator 7, and enameled copper wires or copper nets (not shown in this figure) are attached onto the inside or outside surface of each of the magnetic shield members 66, 67, and 68 in a thermally united structure. Further, the end side parts of the respective magnetic shield members 66 and 67 are connected to the cooling plate 40 in a thermally united structure, and are cooled to about 50 K. Furthermore, the end side part of the magnetic shield member 68 is connected to the second cooling stage 16 and the cooling plate 41 in a thermally united structure, and is cooled to less than about 7 K. The cylinders 64 and 65 include two types of regenerators reciprocating up and down (not shown in this figure). Each regenerator contains storage media such as copper nets, lead balls, rare earth alloy such as $Er_3Ni$, etc., which absorb magnetic flux, and are magnetized. During operation of the refrigerator 7, storage media such as copper nets or lead balls reciprocate up and down in the cylinders 64 and 65, which moves non-uniform magnetic flux around the cylinders 64 and 65. Consequently, eddy current is generated at the copper nets or the lead balls, and magnetic flux is generated from the eddy current, which causes noises. Also, when storage media of $Er_3Ni$ reciprocate up and down, the storage media absorb magnetic flux around the storage media while reciprocating up and down, which causes changes of the magnetic flux, and further generates measurement noises. However, by cooling the magnetic shield members 66, 67, and 68 to turn them to a superconducting state, external magnetic flux around the magnetic shield members 66, 67, and 68 cannot enter these members. Thus, the magnetic flux does not enter the cylinders 64 and 65, and the above noises are not also generated. Moreover, since the magnetic shield members 66, 67, and 68 are at rest while the regenerators reciprocate up and down, these members also do not generate noises.

Thus, according to this embodiment, the generation of magnetic noises due to the reciprocation of the regenerators during operation of the refrigerator 7 can be prevented, which improves the measurement accuracy. Meanwhile, even if the above magnetic shield members 66, 67, and 68 are applied to a conventional cryostat using a refrigerator, it brings similar effects.

In the following, the composition, the operations, and the effects of the cryostat 1 of this embodiment, similar to those of the cryostat 1 shown in FIG. 4, will be further explained. In this embodiment also, when the SQUID elements 2 are installed in the inner container 52, or before the coolant 3 is cooled, a predetermined amount of the coolant 3 is poured into the inner container 52, and the SQUID elements 2 are soaked in the coolant 3 in the small thin inner container 52 with a vertical cross section of an L-letter shape made of epoxy resin including glass fibers. Further, thermal conduction members (not shown in this figure) are connected to the outer surface of the inner container 52 in a thermally united structure to make it easier heat transfer between the upper and lower parts of the inner container 52. Also, a thin flange 53 is provided at the left end side of the inner container 52 in this figure, and the inner container 52 can be opened to the air at the normal temperature by opening the flange 53.

At first, the valve 17 is opened, and the thermal shield space 38 inside the outer container 54 with a vertical cross section of an L-letter shape and the small inner container 52 are evacuated with the vacuum pump 19. The inside of the inner container 52 is evacuated via a ventilating tube 55 and a coolant-vapor-mist separator 56.

Next, the refrigerator 7 is started, and the first and second cooling stages 24 and 16 are cooled. The cooling plate 40 connected to the first cooling stage 24 in a thermally united structure is cooled to about 50 K, and the cooling plate 41 connected to the second cooling stage 16 in a thermally united structure is cooled to less than about 7 K. The cooling plates 40 and 41 are made of non-magnetic material with a high thermal conductivity, such as aluminum or copper, or electrically non-conductive material such as sapphires, ceramics, and so on.

Here, a thermal shield plate 57a is connected to the peripheral part of the cooling plate 40 in a thermally united structure, and the whole thermal shield plate 57a and a thin flange 57b provided at the left end side of the thermal shield plate 57a in this figure are cooled by cooling the connection part between the plates 40 and 57a with the first cooling stage 24. The space surrounded by the thermal shield plate 57a can be opened to the air at the normal temperature by opening the flange 57b.

Further, a thermal shield plate 58a is connected to the peripheral part of the cooling plate 41 in a thermally united structure, and the whole thermal shield plate 58a and a thin flange 58b provided at the left end side of the thermal shield plate 58a in this figure are cooled by cooling the connection part between the plates 41 and 58a with the second cooling stage 16. The space surrounded by the thermal shield plate 58a can be opened to the air at the normal temperature by opening the flange 58b.

Furthermore, a thermal conduction member 59, which is made of non-magnetic material with a high thermal conductivity, such as aluminum or copper, or electrically non-conductive material such as sapphires, ceramics, and so on, is connected to the back part of the cooling plate 41 in a thermally united structure, and the inner container 52 is suspended from the bottom part of the thermal conduction member 59. Also, thermal conduction members 60a and 60b of an L-letter shape, which is made of non-magnetic material with a high thermal conductivity, such as aluminum or copper, or electrically non-conductive material such as sapphires, ceramics, and so on, is connected to the thermal conduction member 59 in a thermally united structure. The coolant 3 in the inner container 52 is uniformly cooled to less than about 7 K by the thermal conduction members 60a and 60b. Therefore, since the whole of the SQUID elements 2 soaked in the coolant 3 contacts the coolant 3, there is little thermal resistance between the thermal conduction members 60a and 60b, and the SQUID elements 2, and the SQUID elements 2 are uniformly cooled to less than about 7 K. Also, the dislocation absorption members 33 are arranged near the inside wall of the lower part in the inner container 52.

Moreover, a flange 61 is provided at the left end side of the outer containment 54, and the outer container 54 can be opened to the air at the normal temperature by opening the flange 61.

According to this embodiment, similar to the embodiment shown in FIG. 4, since the refrigerator 7 can be placed in the vertical direction in which the refrigerator 7 can function with its maximum performance, that is, in the direction in which its low-temperature part is positioned at a low level, and its high-temperature part is positioned at a high level, and the measurement direction of the group of the SQUID elements 2 can be set in the horizontal direction, the magnetic flux generated from the heart can be measured while the measured human 36 is standing. Thus, since the time necessary from the positioning of the cryostat 1 and the measured human 36 to the completion of the measurement carried out for the standing human 36 is shorter than that carried out for the laid human 36, the measurement time can be greatly reduced.

In this embodiment also, if some of the SQUID elements 2 are exchanged during maintenance of the cryostat 1 for containing the SQUID elements 2, the temperature of the whole cryostat 1 is turned to the normal temperature, and the cryostat 1 is declined so that the group of the SQUID elements 2 is faced upward. Further, the valve 17 is opened to turn the inside pressure to the atmospheric pressure, and the flanges 61, 58b, and 57b are opened. The group of the SQUID elements 2 is fixed to the flange 57b with screws. Furthermore, the group of the SQUID elements 2 is taken out of the inner container 52 along with the support mechanisms 10a and 10b for supporting the SQUID elements 2 in the holes provided in each support mechanism, the measurement lead-out wires 9, and the detachable connector 63. The group of the SQUID elements 2 is released by detaching the connector 63 from the group of the SQUID elements 2, and is exchanged with a new group of SQUID elements 2. Afterward, these components are reassembled to turn the inside composition of the inner container 52 to the ordinary composition, and the cryostat 1 for containing the SQUID elements 2 is again operated. Therefore, according to this embodiment, since flanges for opening the inside of the inner container 52 to the air can be provided in the measurement direction of the group of the SQUID elements 2, it is not necessary to take the group of the SQUID elements 2 out of the inner container 52 by opening the flange 43, for exchanging of the group of the SQUID elements 2, which can reduce the time necessary for the exchanging of the SQUID elements 2. Moreover, since there is little pressure difference between the inside and the outside of each cylinder, the pressing force such that the coolant 3 does not leak from the attachment part is sufficient for attaching the flanges 58b and 57b to the respective cylinders 58a and 57a.

Moreover, in this embodiment also, when the thermal shield space 38 inside the outer container 54 of an L-letter shape and the inner container 52 are evacuated by opening the valve 17 and operating the vacuum pump 19, even if there are spaces in which air stagnates, the air stagnating in the spaces can be expelled by the evacuation process, and the coolant 3 enters the spaces. Accordingly, the air remaining in the coolant 3 is almost completely exhausted, which contributes to uniform cooling of the SQUID elements 2.

Further, the cross section of the thermal conduction member 60a arranged at the central position in the inner container 52 is larger than that of the thermal conduction member 60b, which makes the amount of heat transferred by the member 60a larger than that transferred by the member 60b. By the above composition, the coolant 3 in the inner container 52 begins to be solidified from the central part, and the solidified part growths outward, which can reduce the thermal deformation difference between the outer region and the inner region. Thus, by solidifying the coolant 3 around the respective SQUID elements 2 from the central region, it is possible to prevent the SQUID elements 2 from breaking down, which is due to thermal deformation.

In addition, by declining another cryostat 1 for containing the SQUID elements 2 according to this embodiment to measure the magnetic flux generated from the heart from the back side of the measured human 36, the magnetic flux generated from the heat of the measured human 36 laid on its back can be measured from above and below at the same time, which can realize a more accurate and wider measurement. Thus, the magnetic flux distribution can be measured in more detailed.

Furthermore, since the length of the horizontal part in the inner container 52 is comparatively short, the shrinking quantity of the horizontal part due to decrease from the normal temperature to the very low temperature is small. Accordingly, the interval between the outer face of the flange 61 and the SQUID elements 2 very slightly increases when the whole cryostat 1 is cooled to a very low temperature. Therefore, the interval between the heart of the measured human 36 and the SQUID elements 2 also very slightly increases, which further improves the measurement accuracy in comparison with that of a conventional measurement apparatus.

Further still, since there is not a pressure difference between the inside and outside of the inner container, the horizontal cross section of the inner container 52 of an L-letter shape can be fabricated as a rectangular, and a thin plate can be used for the wall of the inner container 52, which can reduce the production cost of the inner container 52.

Figure 6:
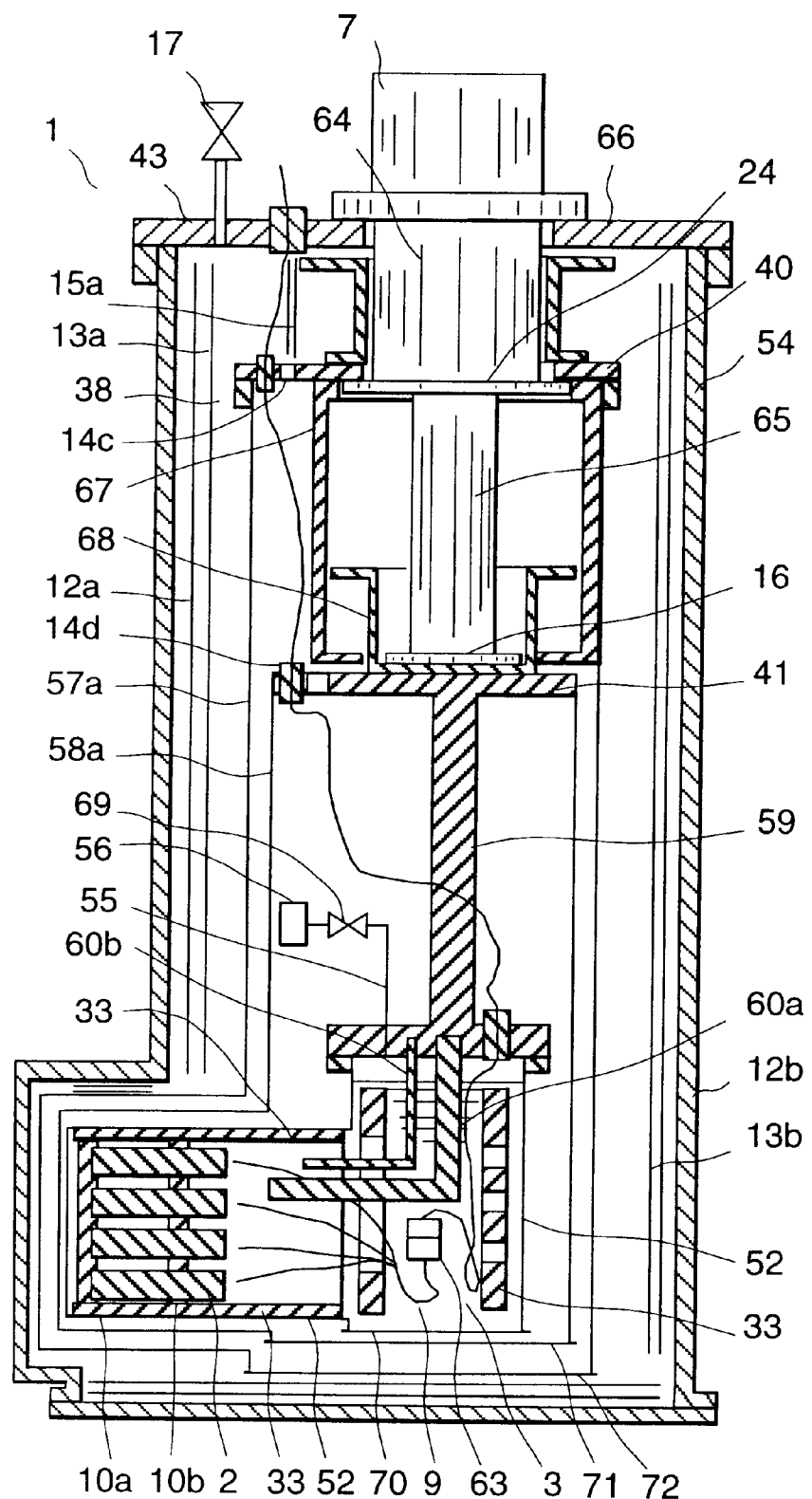
FIG. 6 is a vertical cross section showing the composition of a cryostat for containing SQUID elements of another embodiment according to the present invention.

FIG. 6 shows the composition of a cryostat of another embodiment according to the present invention. This embodiment differs from the embodiment shown in FIG. 5 in a point that a valve 69 which can be operated from the outside of a room temperature is provided at the ventilation tube 55, in a point that the flange 53 attached to the left end side of the SQUID elements is removed, and the aperture at the left end side of the SQUID elements is closed to prevent the coolant 3 from leaking out of the inner container 52 when the cryostat 1 is inverted, and in a point that flanges 70, 71, 72, and 73 are provided at the bottom part in the vertical direction of the inner container 52 and the outer container 54.

By composing the cryostat 1 as described above, the outer container 54 can be opened to the air at the bottom part of the outer container 54 at the normal temperature by opening the flange 73.

In this embodiment, if some of the SQUID elements 2 are exchanged during maintenance of the cryostat 1 for containing the SQUID elements 2, the temperature of the whole cryostat 1 is turned to the normal temperature, and the cryostat 1 for containing the SQUID elements 2 is inverted. Further, after the valve 17 is opened to turn the pressure inside the outer container 54 to the atmospheric pressure, the flanges 70, 71, 72, and 73 are opened. Furthermore, each SQUID element is pulled out of the support mechanisms 10*a* and 10*b* for supporting the SQUID elements 2 in the holes provided in each support mechanism, and the measurement lead-out wires 9 are taken out along with the detachable connector 63. The group of the SQUID elements 2 is released by detaching the connector 63 from the group of the SQUID elements 2, and is exchanged with a new group of SQUID elements 2. Afterward, these components are reassembled to turn the inside composition of the inner container 52 to the ordinary composition, and the cryostat 1 for containing the SQUID elements 2 is again operated. Therefore, according to this embodiment, since the structure at the left end side of the inner container 52 is simplified by composing this structure so as not to be decomposed, the interval between the left end side face of the outer container 54 and the left end side of the group of the SQUID elements 2 can be reduced. Thus, the group of SQUID elements 2 can be approached nearer the measured human body 36, which further improves the measurement accuracy.

Figure 7:
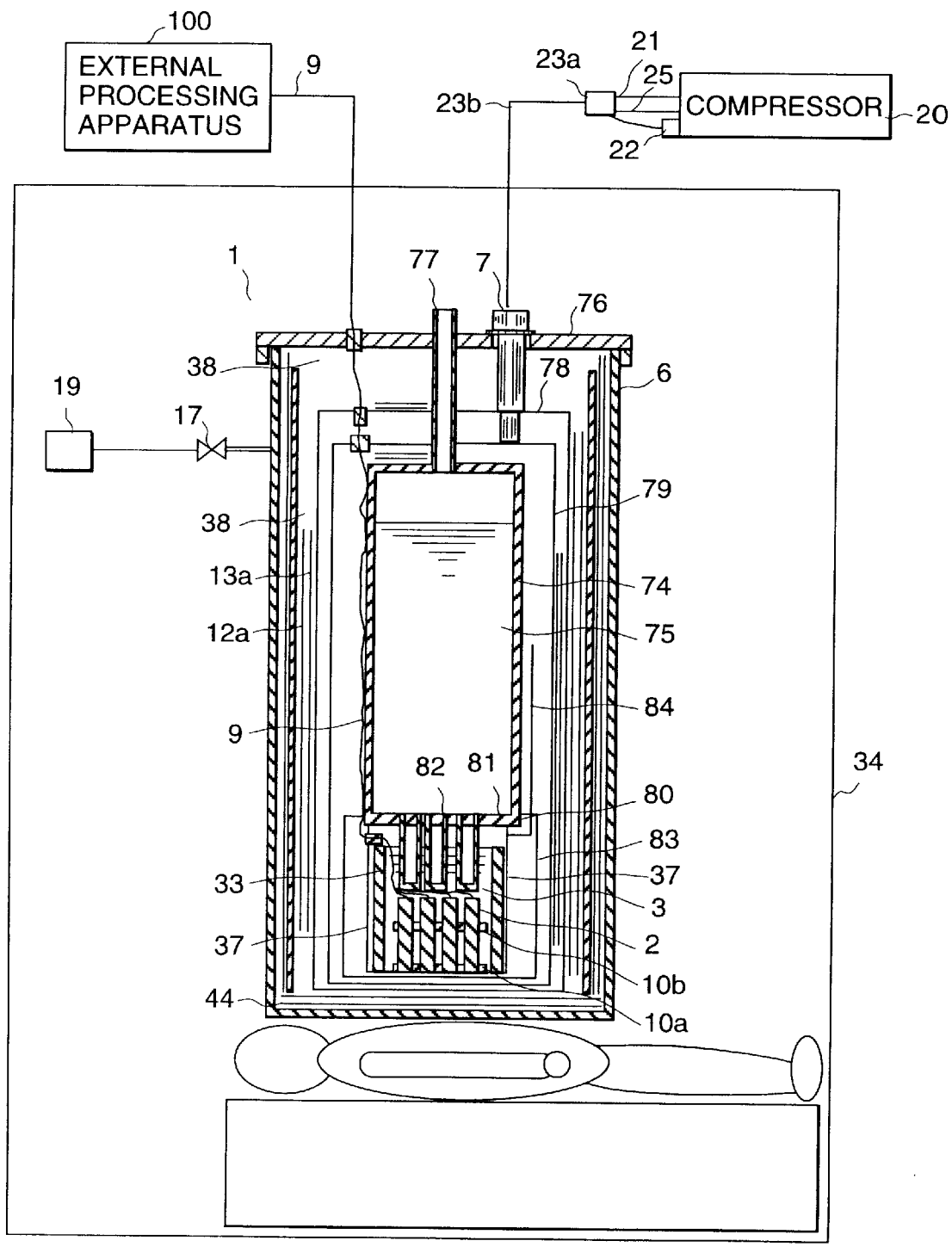
FIG. 7 is a vertical cross section showing the composition of a cryostat for containing SQUID elements of another embodiment according to the present invention.

FIG. 7 shows the composition of a cryostat of another embodiment according to the present invention. This embodiment differs from the embodiment shown in FIG. 2 in a point that refrigeration using liquid helium is used in place of the refrigerator 7 as the coolant cooling means. An inner liquid-helium tank 74 with a withstand pressure of 1 atm is filled with liquid helium 75. The inner liquid-helium tank 74 is suspended from a flange 76, and is supported by a helium feed pipe 77. Thermal shield members 78 and 79 are cooled to about 50 K and about 10 K with the refrigerator 7, respectively. The inner container 37 is suspended from a flange 80, and is supported by the bottom plate of the inner liquid-helium tank 74. The coolant 3 is cooled to about 4.2 K by the liquid helium in heat conduction cylinders 82 made of epoxy resin including glass fibers, or stainless steel. Since the diameter of each of the heat conduction cylinders 82 is small, it can be fabricated with a thin wall plate, which makes the thermal resistance small. A thermal shield member 83 is provided outside the inner container 37, and is connected to a part near the bottom face of the inner liquid-helium tank 74. A ventilation tube 84 of which top is opened to the vacuum space 38 is attached through the wall of the inner container 37, and the inner container 37 is evacuated via the ventilation tube 84.

According to this embodiment, since an exchange of the SQUID elements 2 need not be carried out via the helium feed pipe 77, a pipe of a small diameter can be used for the pipe 77. Therefore, since the withstand pressure of the pipe 77 can be increased, the thickness of the pipe 77 can be reduced. Thus, the amount of heat transferred from normal temperature parts to very low temperature parts can be reduced, which can decrease the evaporation amount of the liquid helium.

Figure 8:
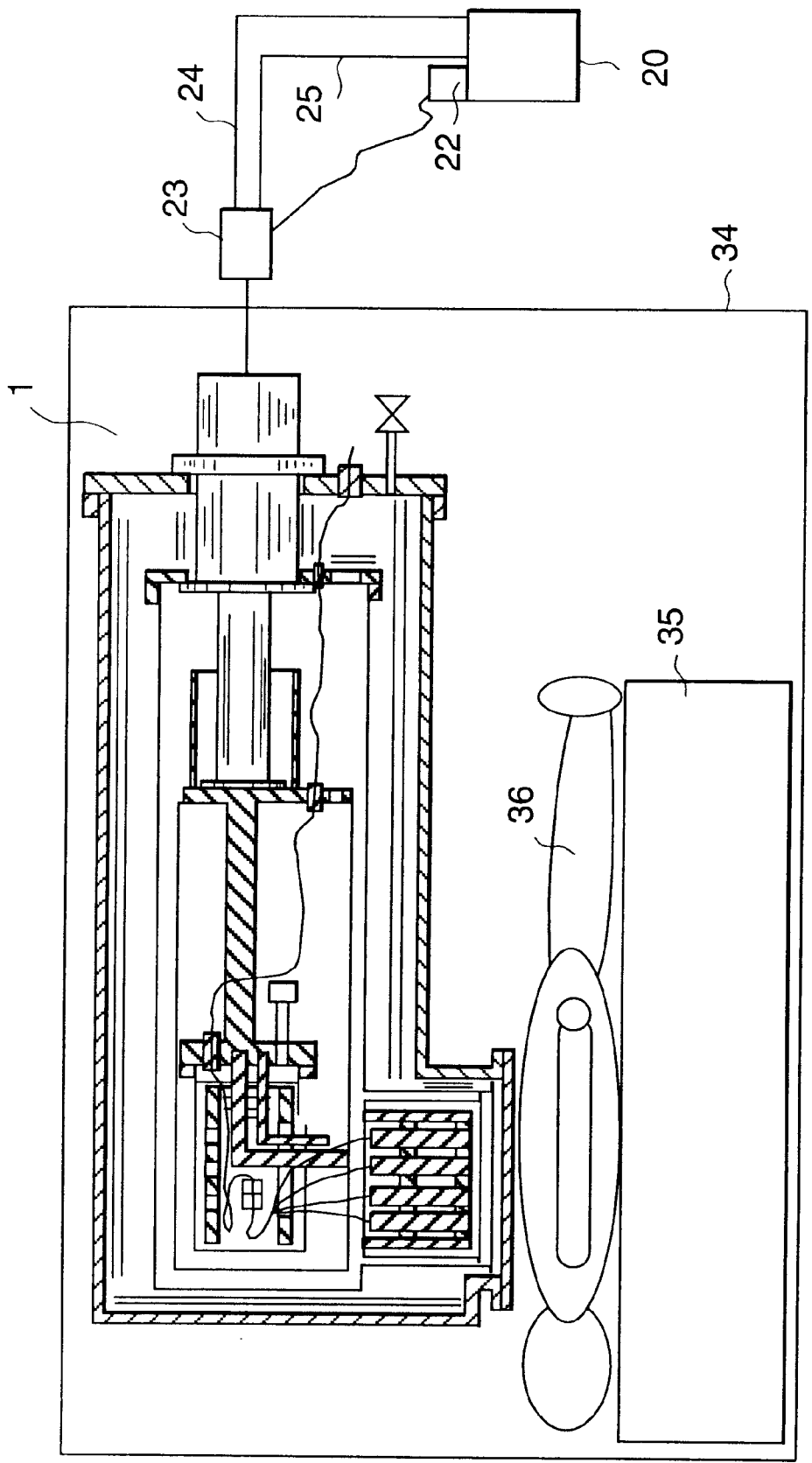
FIG. 8 is a vertical cross section showing the composition of a cryostat for containing SQUID elements of another embodiment according to the present invention.

FIG. 8 shows the composition of another embodiment according to the present invention. This embodiment differs from the embodiment shown in FIG. 4 in a point that the cryostat 1 for containing the SQUID elements 2 is declined in the horizontal direction, and is laid along the axis of the measured human body 36 which is horizontally laid. According to this embodiment, since it is possible to compose the measurement room surrounded by the magnetic shield wall 34 whose height is lower than that of the measurement room in which the cryostat 1 for containing the SQUID elements 2 is vertically arranged, the size of the measurement room surrounded by the magnetic shield wall 34 can be decreased. Moreover, since expensive material such as permalloy is used for the magnetic shield wall 34, the cost of the measurement room can be also reduced.

Figure 9:
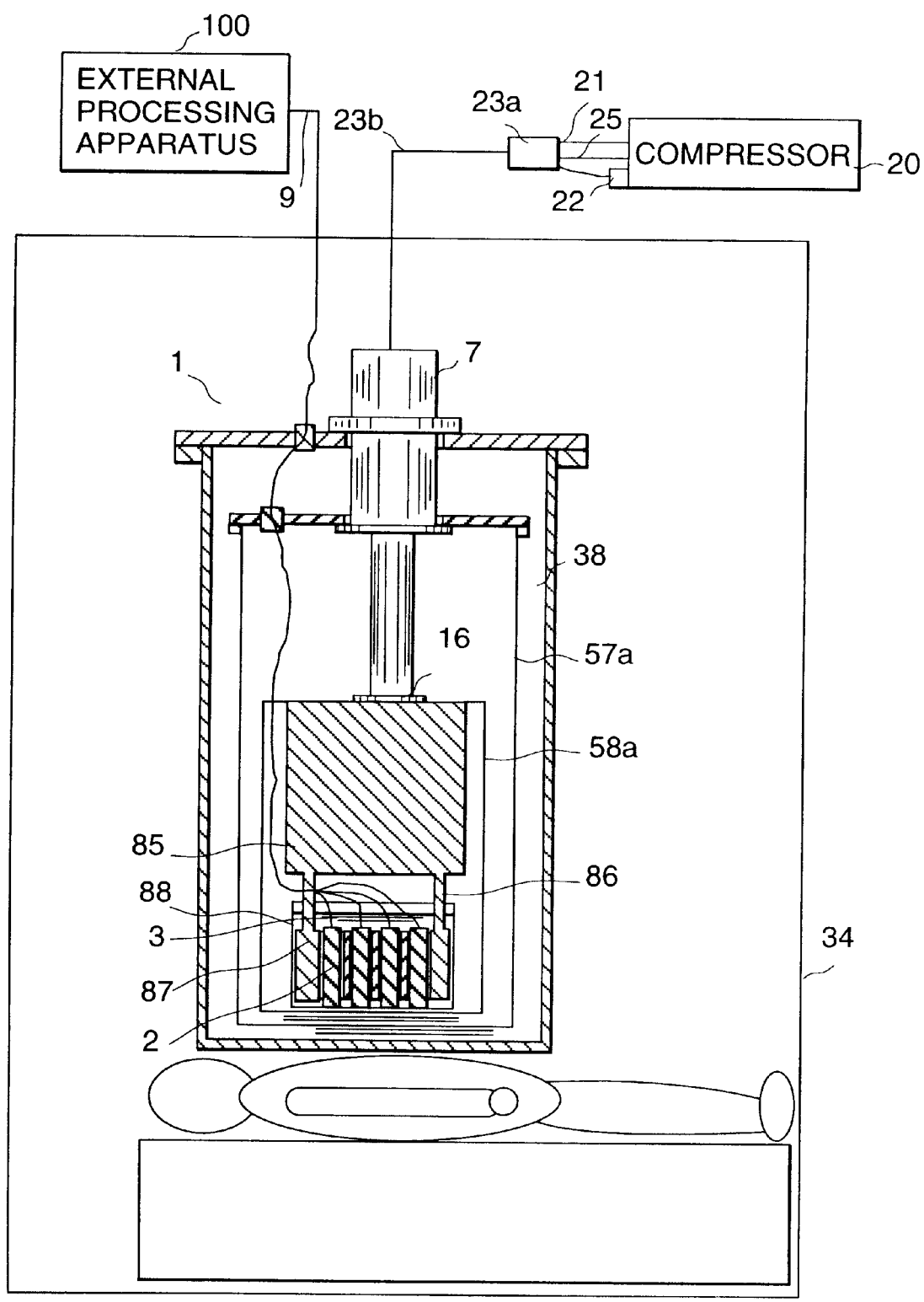
FIG. 9 is a vertical cross section showing the composition of a cryostat for containing SQUID elements of another embodiment according to the present invention.

FIG. 9 shows the composition of a cryostat of another embodiment according to the present invention. This embodiment differs from the embodiment shown in FIG. 6 in a point that the thermal conduction main body 85 with a large horizontal cross section is provided, the inner container 88 includes a multi-hole thermal conduction member 87 fabricated by forming a plurality of vertical holes in a solid body, the multi-hole thermal conduction member 87 being connected to the thermal conduction main body 85 with thermal conduction support members 86, the SQUID elements are inserted into the respective vertical holes of the multi-hole thermal conduction member 87, and the coolant 3 is poured into the inner container 88. According to this embodiment, since the gap between the outer surface of each SQUID element and the inner surface of each hole in a multi-hole thermal conduction member 87 can be set as sufficiently narrow, for example less than 1 mm, generation of cracks in each SQUID element hardly occurs, which can quickly and safely cool the SQUID elements.

Figure 10:
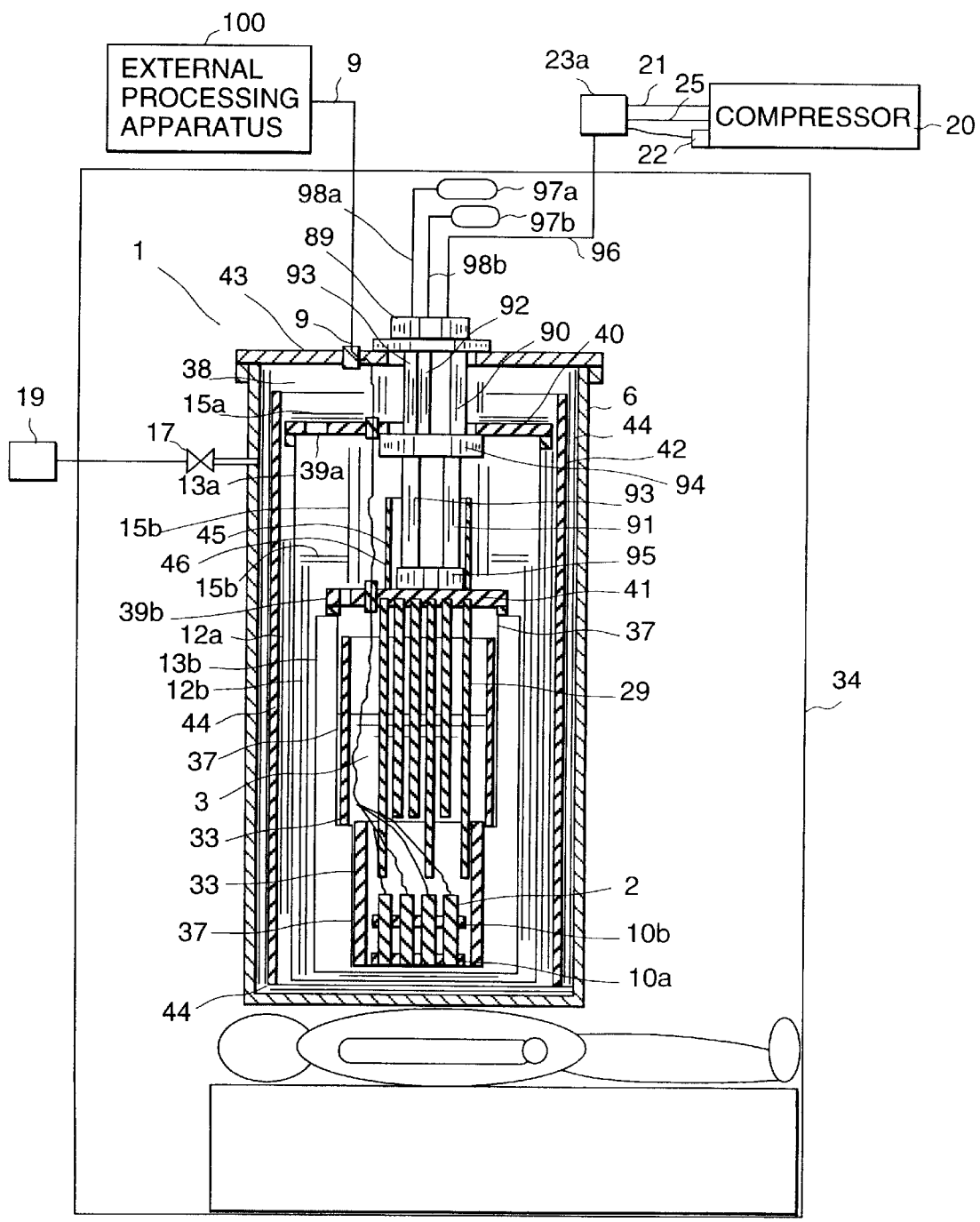
FIG. 10 is a vertical cross section showing the composition of a cryostat for containing SQUID elements of another embodiment according to the present invention, in which a pulse-pipe type refrigerator is used.

FIG. 10 shows the composition of a cryostat of another embodiment according to the present invention. In this embodiment, a pulse-pipe type refrigerator 89 is used as the refrigerator 7 in the embodiment shown in FIG. 2. The pulse-pipe type refrigerator 89 includes the first regenerator 90, the second regenerator 91, the first pulse pipe 92, the second pulse pipe 93, the first cooling stage 94, the second cooling stage 95, a pipe 96 through which gas is fed to the refrigerator 89 from the compressor 20, and is exhausted from the refrigerator 89 to the compressor 20, pressure maintaining tanks 97*a* and 97*b* for regulating the pressure of gas in the first and second pulse pipes 92 and 93, respectively, and pipes 98*a* and 98*b* communicating with normal temperature parts of the first and second pulse pipes 92 and 93, and with the pressure regulating tanks 97*a* and 97*b*, respectively, the pressure loss due to gas-flow passage resistance being adjusted by the diameter and the length of the pipes 98*a* and 98*b*. The first and second regenerators 90 and 91 are serially connected to each other, and the first pulse pipe 92 is connected to the second pulse pipe 93 in parallel. One terminal part of the first pulse pipe 92 communicates with the first regenerator 90 in the first cooling stage 94, and one terminal part of the second pulse pipe 93 communicates with the second regenerator 91 in the first cooling stage 95. Further, the middle part of the second pulse pipe 93 is connected to the first cooling stage 94 in a thermally united structure. The high-pressure helium gas fed from the compressor 20 via the flow-path switching device 23*a* is fed to the top part of the pulse-pipe type refrigerator 89 via the pipe 96. Successively, a partial volume of the high-pressure helium gas flows into the top part of the first regenerator 90, being cooled to about 50 K, and flows into the top part of the second regenerator 91 and the bottom part of the first pulse pipe 92. The other volume of the high-pressure helium gas is cooled to about 50 K with the second regenerator 91, and flows into the bottom part of the second pulse pipe 93. Further, when the flow path of the high-pressure helium gas which has passed through the bottom part of the first pulse pipe 92 is switched to a low-pressure circuit of the compressor 20 by the flow-path switching device 23*a*, the helium gas is adiabatically expanded, and the temperature of this gas rapidly decreases. Furthermore, this helium gas cools the first cooling stage 94 and the first regenerator 90 successively, and returns to the compressor 20. Also, the flow path of the high-pressure helium gas which has passed through the bottom part of the second pulse pipe 9 is switched to the low-pressure circuit of the compressor 20 by the flow-path switching device 23a. At this moment, the helium gas is adiabatically expanded, and the temperature of this gas rapidly decreases. Further, this helium gas cools the second cooling stage 95 and the second regenerator 91 successively, and returns to the compressor 20. The middle part of the second pulse pipe 93 is cooled by the first cooling stage 94. The pressure maintaining tanks 97a and 97b adjust the pressure in the top part of each pulse pipe so that changes of this pressure possess a phase difference to those of the pressure in the flow-path switching device 23a so as to make the pulse-pipe type refrigerator 89 efficiently perform its cooling function. Since the pulse-pipe type refrigerator 89 is used, the level of vibration generated by the refrigerator 89 is very low, and the level of noises due to the vibration, which are transferred to SQUID elements, is also very low. Therefore, since, before starting of the measurement, the positioning of the SQUID elements 2 to the measured part of the measured human 36 can be performed while the refrigerator 89 is operated, the positioning can be easily carried out in a short time. Moreover, in order to completely suppress generation of the vibration noise or electrical noises, the pulse-pipe type refrigerator 89 is stopped during the measurement.

Although the SQUID elements and the refrigerator 7 are mechanically integrated in any one of the above embodiments, the composition in that the SQUID elements can be disconnected from the refrigerator 7 is also possible (not shown in a figure). In this composition, after the coolant 3 is solidified, and the SQUID elements 2 is cooled, the inner container 37 containing the cooled SQUID elements 2 and the solidified coolant 3 are separated from the refrigerator 7. Thus, the inner container 37 containing the cooled SQUID elements 2 and the solidified coolant 3 can be freely moved, which makes the transfer control of the SQUID elements 2 easier.

Furthermore, in the above embodiment, the coolant 3 directly permeates the Josephson junction of each SQUID element. However, in order to prevent a thermal deformation of the Josephson junction due to solidification of the coolant 3, only each the Josephson junction part is sealed, for example, with resin, so that the coolant 3 does not directly permeate each the Josephson junction, which can also bring almost the same cooling effect to each SQUID element as that in the case that the Josephson junction is not sealed.

Industrial Applicability

The cryostat of the present invention can be applied to contain a superconducting magnet, a group of semiconductor elements whose performances are improved at a low temperature, for example CMOSs, or living cells, besides a group of SQUID elements.

Moreover, the present invention is applicable to a cooling system for cooling a substance such as a superconducting member which turns to a superconducting state below the solidifying point of coolant.

What is claimed is:

1. A cryostat for containing objects to be cooled, said cryostat comprising:
    an inner container for containing said objects to be cooled and coolant to cool said objects; and
    cooling means for cooling said objects by cooling said coolant, which has been poured around said objects in said inner container from the outside of said inner container so a to soak said objects in said coolant before said inner container is closed, and the cooling of said coolant is started, to a predetermined temperature at which said coolant is in a solidified state;
    wherein a solidifying point of said coolant is less than the normal temperature, and one of coolant in a fluid state under the normal temperature and pressure, and coolant which is melted to be in a fluid state by being heated under the normal pressure in advance, is used as said coolant to be poured into said inner container.

2. A cryostat according to claim 1, wherein said cooling means solidifies said poured coolant from a central region in said coolant.

3. A cryostat according to claim 1, wherein said coolant is solid at the normal temperature.

4. A cryostat according to claim 3, wherein wax which is melted to be in a fluid state, is used as said coolant.

5. A cryostat according to claim 4, wherein said wax is paraffin.

6. A cryostat according to claim 1, wherein high thermal-conductivity substances whose thermal conductivity is higher than that of said coolant are intermixed with said coolant.

7. A cryostat according to claim 1, wherein heat accumulating substances whose specific heat is larger than that of said coolant are intermixed with said coolant.

8. A cryostat according to claim 1, wherein thermal shield means is provided around an outside wall of said inner container, said thermal shield means being cooled to the temperature of said cooled coolant.

9. A cryostat according to claim 1, wherein displacement absorption means for absorbing displacement of said coolant due to expansion of said coolant is provided in said inner container.

10. A cryostat according to claim 1, wherein a composition of said inner container is such that said cooled objects put in a bottom face region can be taken out to the air in a state in which the inside of said cryostat is at the normal temperature.

11. A cryostat according to claim 1, wherein said inner container possesses a function to absorb displacement of said coolant due to expansion of said coolant.

12. A cryostat according to claim 1, wherein said cooling means is a pulse-pipe type refrigerator.

13. A cryostat according to claim 1, wherein temperature sensors are provided in said objects, and a cooling state of said objects is monitored by detecting a temperature distribution in said objects with said temperature sensors.

14. A cryostat according to claim 13, wherein heating means is provided at each of said objects.

15. A cryostat according to claim 1, wherein there is no pressure difference between the inside and outside of said inner container.

16. A cryostat according to claim 1, wherein said inner container is a container whose cross section in the longitudinal direction of this container is an L-letter shape, possessing a pipe part perpendicular to said longitudinal direction, and said objects are arranged in a bottom face region of said pipe part.

17. A cryostat according to claim 1, wherein a gas absorption member is provided outside said inner container.

18. A cryostat according to claim 1, wherein said cooled objects are SQUID elements.

19. A cryostat according to claim 1, wherein a multi-hole thermal conduction member fabricated by forming a plurality of holes perpendicular to a bottom face of said inner container in a solid body is arranged in a bottom face region, and each of SQUID elements of said cooled objects is inserted into each of said holes in said multi-hole thermal conduction member.

20. A cryostat for containing objects to be cooled, said cryostat comprising:

an inner container for containing at least one SQUID element to be cooled and coolant to cool said SQUID element; and cooling means for cooling said objects by cooling said coolant, which has been poured around said objects in said inner container from the outside of said inner container so as to soak said objects in said coolant before said inner container is closed, the cooling of said coolant being started to a predetermined temperature at which said coolant is in a solidified state;

wherein a refrigerator in said cooling means includes a portion which absorbs magnetic flux applied to said refrigerator, and a portion in which eddy current is generated by said magnetic flux, at least a part of each portion being covered with a superconducting member.

21. A magnetism measurement apparatus comprising:

at least a cryostat including an inner container for containing at least one SQUID element to be cooled and coolant to cool said SQUID element, cooling means for cooling said at least one SQUID element by cooling said coolant, which has been poured around said at least one SQUID element in said inner container from the outside of said inner container so as to soak said at least one SQUID element in said coolant before said inner container is closed, and the cooling of said coolant is started to a predetermined temperature at which said coolant is in a solidified state; and a cryostat transferring apparatus for transferring said cryostat to a place corresponding to a measurement position in a measured body and a measurement direction toward said measured body;

wherein a solidifying point of said coolant is less than the normal temperature, and one of coolant in a fluid state under the normal temperature and pressure, and coolant which is melted to be in a fluid state by being heated under the normal pressure in advance, being used as said coolant to be poured into said inner container.

22. A magnetism measurement apparatus comprising:

at least an outer container including an inner container for containing at least one SQUID element to be cooled and coolant to cool said at least one SQUID element;

a cooling unit detachably connected to said inner container, for cooling said at least one SQUID element by cooling said coolant, which has been poured around said at least one SQUID element in said inner container from the outside of said inner container so as to soak said at least one SQUID element in said coolant before said inner container is closed, the cooling of said coolant being started to a predetermined temperature at which said coolant is in a solidified state;

a processing unit for processing measurement-information on a measured body, obtained by said SQUID element; and a container transferring unit for transferring said outer container corresponding to a measurement position of a measured body and a measurement direction toward said measured body;

wherein a solidifying point of said coolant is less than the normal temperature, and one of coolant in a fluid state under the normal temperature and pressure, and coolant which is melted to be in a fluid state by being heated under the normal pressure in advance, being used for said coolant to be poured into said inner container.

23. A magnetism measurement apparatus according to one of claim 21 and claim 22, wherein a temperature sensor is provided at said SQUID element, and a cooling state of said SQUID element is monitored by processing information sent from said temperature sensor with said processing unit.

24. A method of operating a magnetism measurement apparatus including at least a cryostat including an inner container for containing at least one SQUID element to be cooled and coolant to cool said SQUID element, and cooling means containing a refrigerator, for cooling said SQUID element to a predetermined temperature; and a cryostat transferring apparatus for transferring said cryostat to a place corresponding to a measurement position in a measured body and a measurement direction toward said measured body; said method comprising the steps of:

pouring said coolant into said inner container by a predetermined amount;

evacuating said cryostat;

cooling and solidifying said coolant cooling said solidified coolant to a predetermined temperature;

transferring said magnetism measurement apparatus to a position suitable to measure said body to be measured, with said cryostat transferring apparatus; and start a measurement.

25. A method of operating a magnetism measurement apparatus according to claim 23, wherein said refrigerator is stopped during said measurement.

* * * * *